(12) United States Patent
Wong et al.

(10) Patent No.: US 11,502,170 B2
(45) Date of Patent: Nov. 15, 2022

(54) SEMICONDUCTOR DEVICE AND MANUFACTURING METHOD THEREOF

(71) Applicant: INNOSCIENCE (ZHUHAI) TECHNOLOGY CO., LTD., Zhuhai (CN)

(72) Inventors: King Yuen Wong, Zhuhai (CN); Ronghui Denys Hao, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 235 days.

(21) Appl. No.: 16/768,090

(22) PCT Filed: Mar. 23, 2020

(86) PCT No.: PCT/CN2020/080625
§ 371 (c)(1),
(2) Date: May 29, 2020

(87) PCT Pub. No.: WO2021/189182
PCT Pub. Date: Sep. 30, 2021

(65) Prior Publication Data
US 2022/0123109 A1    Apr. 21, 2022

(51) Int. Cl.
*H01L 29/08*    (2006.01)
*H01L 27/088*    (2006.01)
(Continued)

(52) U.S. Cl.
CPC ........ *H01L 29/0847* (2013.01); *H01L 27/088* (2013.01); *H01L 29/402* (2013.01);
(Continued)

(58) Field of Classification Search
CPC .............. H01L 29/7786; H01L 29/404; H01L 29/7783; H01L 29/7787; H01L 29/41758
See application file for complete search history.

(56) References Cited

U.S. PATENT DOCUMENTS 9,018,634 B2    4/2015  Tanaka et al.
10,211,329 B2    2/2019  Kim et al.
(Continued)

FOREIGN PATENT DOCUMENTS

CN    101960576 A    1/2011
CN    105720097 A    6/2016
(Continued)

OTHER PUBLICATIONS

International Search Report of corresponding PCT Patent Application No. PCT/CN2020/080625 dated Nov. 25, 2020.

*Primary Examiner* — Changhyun Yi
(74) *Attorney, Agent, or Firm* — Idea Intellectual Limited; Margaret A. Burke; Sam T. Yip

(57) ABSTRACT

Some embodiments of the present disclosure provide a semiconductor device, including a substrate, a channel layer, a barrier layer, a p-type doped III-V layer, a source, a drain and a doped semiconductor layer. The channel layer is disposed on the substrate. The barrier layer is disposed on the channel layer. The p-type doped III-V layer is disposed on the barrier layer. A gate is disposed on the p-type doped III-V layer. The source and the drain are arranged on two opposite sides of the gate. The doped semiconductor layer is provided with a first side close to the gate and a second side away from the gate. The drain covers the first side of the doped semiconductor layer.

19 Claims, 28 Drawing Sheets

(51) Int. Cl.
*H01L 29/40* (2006.01)
*H01L 29/66* (2006.01)
*H01L 29/20* (2006.01)
*H01L 29/205* (2006.01)
*H01L 29/267* (2006.01)

(52) U.S. Cl.
CPC ...... *H01L 29/404* (2013.01); *H01L 29/66462* (2013.01); *H01L 29/66969* (2013.01); *H01L 29/2003* (2013.01); *H01L 29/205* (2013.01); *H01L 29/267* (2013.01)

(56) References Cited

U.S. PATENT DOCUMENTS

2011/0260217 A1  10/2011 Okamoto et al.
2014/0138704 A1   5/2014 Tanaka et al.
2017/0330880 A1* 11/2017 Takeuchi .............. H01L 29/808

FOREIGN PATENT DOCUMENTS

| CN | 107240549 A | 10/2017 |
| CN | 107331697 A | 11/2017 |
| CN | 109148575 A | 1/2019 |

* cited by examiner

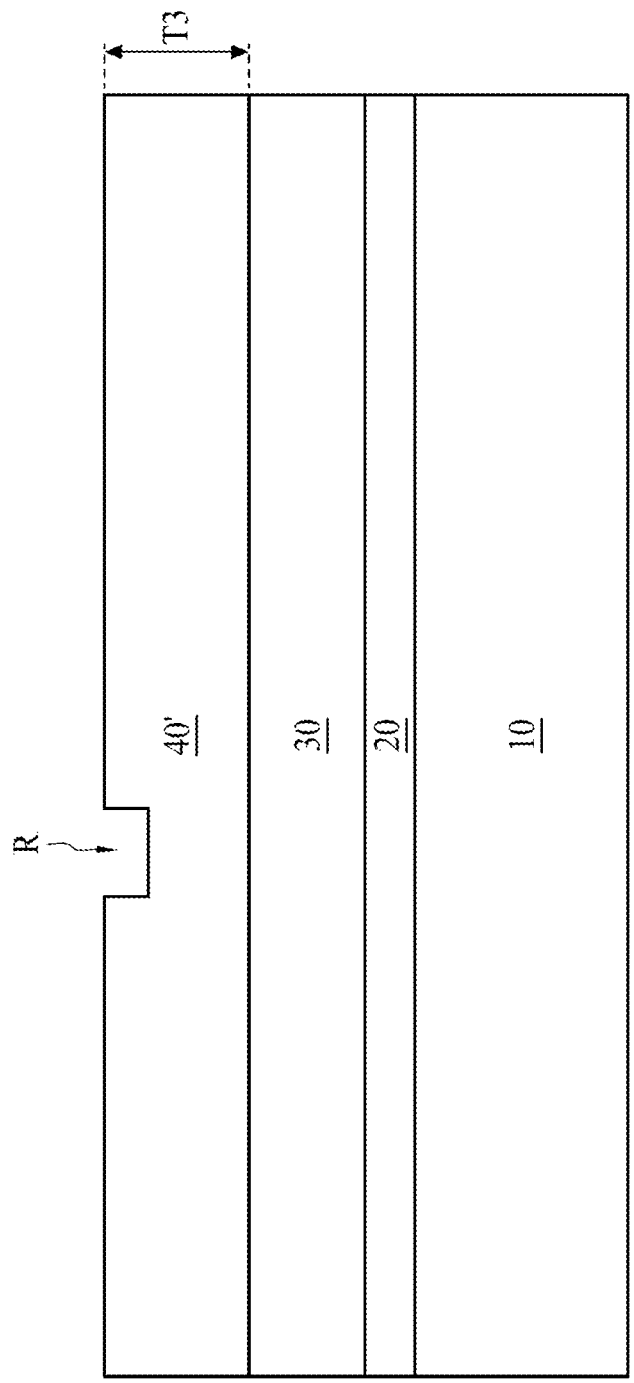

SEMICONDUCTOR DEVICE AND MANUFACTURING METHOD THEREOF

BACKGROUND OF THE INVENTION

1. Field of the Invention

The present disclosure relates to a semiconductor device and a manufacturing method thereof, and more particularly to a semiconductor device with a doped semiconductor layer and a manufacturing method thereof.

2. Description of the Related Art

Components including a direct bandgap semiconductor, such as a semiconductor component including III-V materials or III-V compounds (Category: III-V compounds) can operate or work under various conditions or environments (such as different voltages and frequencies) because of its characteristics. The above semiconductor component may include a heterojunction bipolar transistor (HBT), a heterojunction field effect transistor (HFET), a high-electron-mobility transistor (HEMT) or a modulation-doped FET (MODFET), etc.

Since a buffer layer in the HEMT will capture two-dimensional electron gas (2DEG) at a heterojunction of a channel layer and a barrier layer, the electron concentration of the 2DEG is decreased, and the on-resistance of the HEMT is increased. Thus, it is necessary to seek for a new semiconductor device.

SUMMARY OF THE INVENTION

Some embodiments of the present disclosure provide a semiconductor device, including a substrate, a channel layer, a barrier layer, a p-type doped III-V layer, a source, a drain and a doped semiconductor layer. The channel layer is disposed on the substrate. The barrier layer is disposed on the channel layer. The p-type doped III-V layer is disposed on the barrier layer. A gate is disposed on the p-type doped III-V layer. The source and the drain are disposed on two opposite sides of the gate. The doped semiconductor layer is provided with a first side close to the gate and a second side away from the gate. The drain covers the first side of the doped semiconductor layer.

Some embodiments of the present disclosure provide a semiconductor device, including a substrate, a channel layer, a barrier layer, a first gate, a second gate, a drain, a first source, a second source, and a doped semiconductor layer. The channel layer is disposed on the substrate. The barrier layer is disposed on the channel layer. The first gate and the second gate are disposed on the barrier layer. The drain is disposed between the first gate and the second gate. The first source and the second source are respectively disposed on one side of the first gate away from the drain and one side of the second gate away from the drain. The doped semiconductor layer is provided with a first side close to the first gate and a second side close to the second gate. The drain covers the first side and the second side of the doped semiconductor layer.

Some embodiments of the present disclosure provide a manufacturing method of a semiconductor device. The method includes: providing a substrate; forming a channel layer on the substrate; forming a barrier layer on the channel layer; forming a p-type doped III-V layer on the barrier layer; forming a gate on the p-type doped III-V layer; forming a doped semiconductor layer on the barrier layer; and forming a source and a drain on two opposite sides of the gate, wherein the drain covers one side of the doped semiconductor layer close to the gate.

BRIEF DESCRIPTION OF THE DRAWINGS

The aspects of the present disclosure will become more comprehensible from the following detailed description made with reference to the accompanying drawings. It should be noted that, various features may not be drawn to scale. In fact, the sizes of the various features may be increased or reduced arbitrarily for the purpose of clear description.

FIG. 13A, FIG. 13B and FIG. 13C show a plurality of operations for manufacturing the semiconductor device according to the comparative example.

PREFERRED EMBODIMENT OF THE PRESENT INVENTION

Figure 1A:
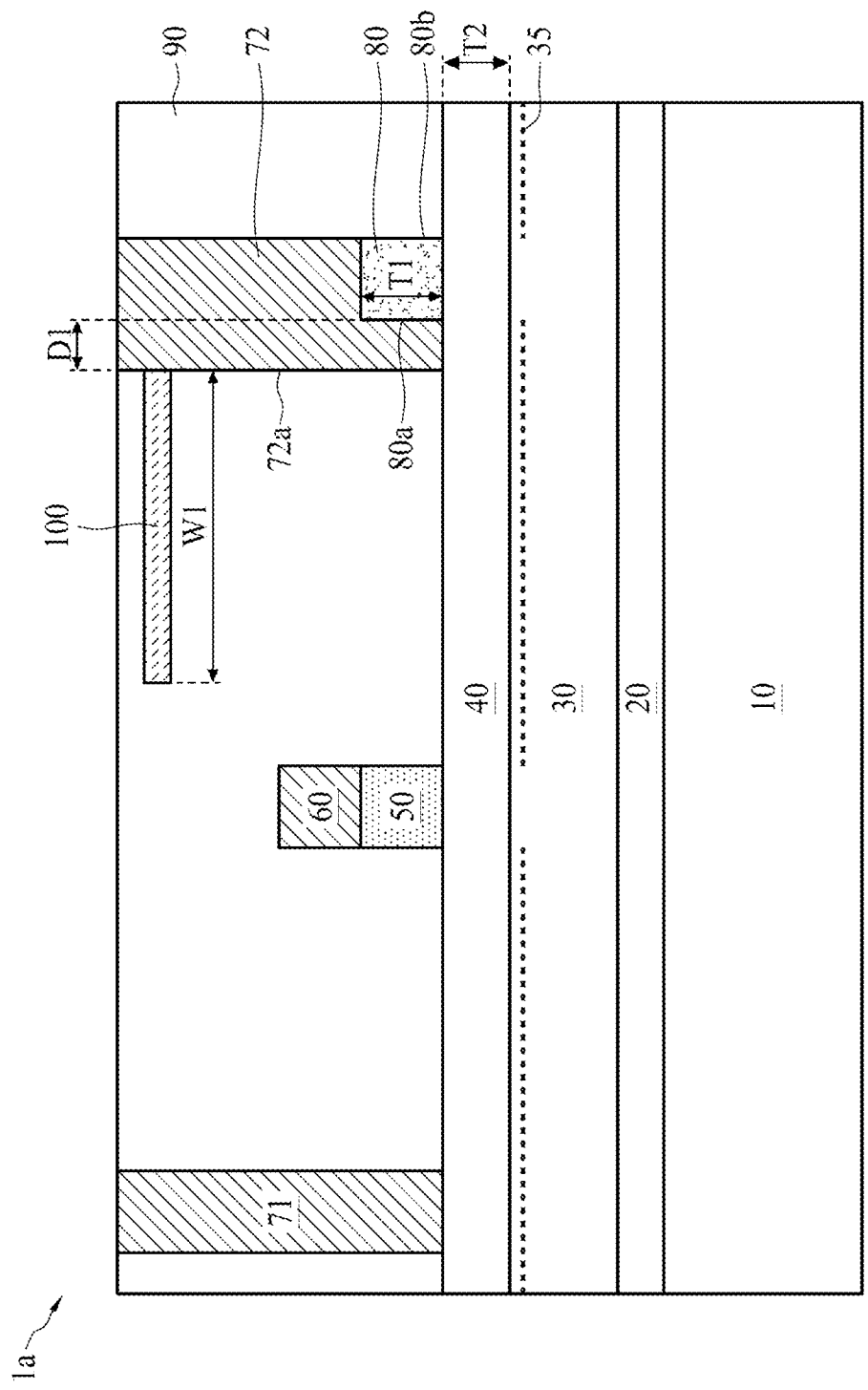
FIG. 1A shows a sectional view of a semiconductor device according to certain embodiments of the present disclosure.

The following disclosure provides many different embodiments or examples for implementing different features of the provided subject matter. Specific examples of components and arrangements are described below. Certainly, these descriptions are merely examples and are not intended to be limiting. In the present disclosure, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in the present disclosure, reference numerals and/or letters may be repeated in examples. This repetition is for the purpose of simplification and clarity, and does not indicate a relationship between the described various embodiments and/or configurations.

The embodiments of the present disclosure are described in detail below. However, it should be understood that many applicable concepts provided by the present disclosure may be implemented in a plurality of specific environments. The described specific embodiments are only illustrative and do not limit the scope of the present disclosure.

FIG. 1A shows a semiconductor device 1a according to certain embodiments of the present disclosure.

As shown in FIG. 1A, the semiconductor device 1a may include a substrate 10, a channel layer 30, a barrier layer 40, a p-type doped III-V layer 50, a gate 60, a source 71, a drain 72 and a doped semiconductor layer 80.

The substrate 10 may include, for example but not limited to, silicon (Si), doped silicon (doped Si), silicon carbide (SiC), silicon germanium (SiGe), gallium arsenide (GaAs), or other semiconductor materials. The substrate 10 may include, for example but not limited to, sapphire, silicon on insulator (SOI) or other suitable materials.

The channel layer 30 is disposed on the substrate 10. The channel layer 30 may include a group III-V layer. The channel layer 30 may include, for example but not limited to, a group III nitride such as a compound $In_xAl_yGa_{1-x-y}N$, where $x+y \le 1$. The group III nitride may further include, for example but not limited to, a compound $Al_yGa_{(1-y)}N$, where $y \le 1$. In some embodiments, the channel layer 30 may include a GaN layer, and GaN may have a bandgap of about 3.4 V. In some embodiments, the thickness of the channel layer 30 is, but not limited to, between about 0.5 μm to about 10 μm.

The barrier layer 40 is disposed on the channel layer 30. The barrier layer 40 may include a group III-V layer. The barrier layer 40 may include, for example but not limited to, a III nitride such as a compound $In_xAl_yGa_{1-x-y}N$, where $x+y \le 1$. The group III nitride may further include, for example but not limited to, a compound $Al_yGa_{(1-y)}N$, where $y \le 1$. The barrier layer 40 may have a bandgap relatively larger than the bandgap of the channel layer 30. The barrier layer 40 may include AlGaN, and the AlGaN may have a bandgap of about 4.0 V. The thickness T2 of the barrier layer 40 is, but not limited to, about 10 nm to about 40 nm.

A heterojunction is formed between the barrier layer 40 and the channel layer 30. Polarization of heterojunctions of different nitrides forms a 2DEG area 35 in the channel layer 30. The 2DEG area 35 is generally formed in a layer (such as GaN) with a smaller bandgap.

In some embodiments, the semiconductor device 1a includes the p-type doped III-V layer 50. The p-type doped III-V layer 50 is disposed on the barrier layer 40. The p-type doped III-V layer 50 may include, for example but not limited to, doped gallium nitride (doped GaN), doped aluminum gallium nitride (doped AlGaN), doped indium gallium nitride (doped InGaN) and other doped III-V compounds. The p-type doped III-V layer 50 may include a p-type dopant or other dopants. In some embodiments, exemplary dopants may include, for example but not limited to, magnesium (Mg), zinc (Zn), cadmium (Cd), silicon (Si), germanium (Ge), etc. In some embodiments, the p-type doped III-V layer 50 is p-type doped GaN (p-GaN). In some embodiments, the p-type doped III-V layer 50 is a crystal structure.

The gate 60 is disposed on the p-type doped III-V layer 50. The gate 60 may include, but is not limited to, a gate dielectric layer and gate metals arranged on the gate dielectric layer. The gate dielectric layer may include one or more layers of dielectric materials, such as silicon oxide, silicon nitride, a high-dielectric-constant dielectric material or other suitable dielectric materials. The gate metals may include, for example but not limited to, titanium (Ti), tantalum (Ta), wolfram (W), aluminum (Al), cobalt (Co), copper (Cu), nickel (Ni), platinum (Pt), plumbum (Pb), molybdenum (Mo) and compounds thereof (for example but not limited to, titanium nitride (TiN), tantalum nitride (TaN), other conductive nitrides, or conductive oxides), metal alloys (such as aluminum copper (Al—Cu)), or other suitable materials.

In some embodiments, the semiconductor device 1a is an enhancement mode device. The enhancement mode device is preset to be in an OFF state when the gate 60 is in a zero-bias state. By applying a voltage to the gate 60, electrons or charges will be induced in an area below the gate 60, and the area may be called an electron or charge inversion layer. If the voltage is increased, the number of the induced electrons or charges is also increased. The minimum voltage needing to be increased for forming the inversion layer is called a threshold voltage.

In some embodiments, the p-type doped III-V layer 50 can form a PN junction with the barrier layer 40. The PN junction may be configured to deplete the 2DEG area 35. Since the PN junction depletes the 2DEG area 35, when the gate 60 is in the zero-bias state, no current passes through the semiconductor device 1a, that is, a threshold voltage of the semiconductor device 1a is a positive value. The p-type doped III-V layer 50 can help to reduce leakage currents and improve the threshold voltage.

The source 71 is disposed on the barrier layer 40. The drain 72 is disposed on the barrier layer 40. In FIG. 1A, the source 71 and the drain 72 are respectively arranged on two sides of the gate 60, but the source 71, the drain 72 and the gate 60 may have different configurations in other embodiments of the present disclosure due to design requirements. Besides, in other embodiments, the source 71 can penetrate through the barrier layer 40 and make contact with the channel layer 30. In other embodiments, the drain 72 can penetrate through the barrier layer 40 and make contact with the channel layer 30. Whether the source 71 and the drain 72 penetrate through the barrier layer 40 and/or make contact with the channel layer 30 or not may have different configurations in other embodiments of the present disclosure due to the design requirements.

In some embodiments, the source 71 and the drain 72 may include, for example but not limited to, conductor materials. The conductor materials may include, for example but not limited to, metals, alloys, doped semiconductor materials (such as doped crystalline silicon) or other suitable conductor materials.

The doped semiconductor layer 80 is disposed on the barrier layer 40. In some embodiments, the doped semiconductor layer 80 may be inlaid or embedded into the drain 72. In some embodiments, the doped semiconductor layer 80 includes p-type dopants. In some embodiments, the material of the doped semiconductor layer 80 includes a p-type doped semiconductor material. In some embodiments, the material of the doped semiconductor layer 80 includes p-GaN, p-AlGaN, p-Si, pNiOx, p-Cu$_2$O, p-GaAs or a combination of the above. The above p-type dopants include magnesium (Mg), zinc (Zn), cadmium (Cd), silicon (Si), germanium (Ge), calcium (Ca), iron (Fe), carbon (C) and oxygen (O). The doped semiconductor layer 80 may be configured to provide a hole to the buffer layer 20 to be combined with a negative charge in the buffer layer 20.

In some embodiments, the doped semiconductor layer 80 may be of a crystal structure, such as a single-crystal structure. In some embodiments, the doped semiconductor layer 80 may be of a polycrystalline structure. In some embodiments, the doped semiconductor layer 80 may be of an amorphous structure. In some embodiments, the material of the doped semiconductor layer 80 may be different from the material of the p-type doped III-V layer 50.

The doped semiconductor layer 80 is provided with a side (or a side surface) 80a close to the gate 60 and a side (or a side surface) 80b away from the gate 60. In some embodiments, the drain 72 covers the side 80a. In some embodiments, the drain 72 completely covers the side 80a. In some embodiments, the drain 72 makes contact with the side 80a. In some embodiments, the drain 72 directly makes contact with the side 80a. In some embodiments, a part of the drain 72 may be located between the gate 60 and the side 80a.

In some embodiments, the drain 72 exposes the side 80b. In some embodiments, a side 72b of the drain 72 may be aligned with the side 80b. In some embodiments, the side 72b may be located between the side 80a and the side 80b, to make the drain 72 expose the side 80b.

A distance D1 is formed between the side 72a of the drain 72 and the side 80a of the doped semiconductor layer 80. In some embodiments, the distance D1 ranges from about 100 nm to 200 nm. In some embodiments, the distance D1 ranges from about 200 nm to 1 µm. In some embodiments, the distance D1 ranges from about 1 µm to 20 µm. When the distance D1 is within the above ranges, it can be guaranteed that a saturation current of the semiconductor device 1a is not affected by the doped semiconductor layer 80.

In some embodiments, the doping concentrations of the above dopants range from $10^{16}$ cm$^{-3}$ to $10^{20}$ cm$^{-3}$. When the doping concentrations of the dopants of the doped semiconductor layer 80 are within the above range, current collapse can be restrained. However, if the doping concentrations of the dopants are too high, the concentrations at which the dopants are activated will be decreased. Therefore, the doping concentrations of the dopants should be less than $10^{20}$ cm$^{-3}$.

In some embodiments, the thickness T1 of the doped semiconductor layer 80 ranges from about 1 nm to 100 nm, and in this case, the doping concentrations of the dopants of the doped semiconductor layer 80 range from $10^{18}$ cm$^{-3}$ to $10^{20}$ cm$^{-3}$. In some embodiments, the thickness T1 of the doped semiconductor layer 80 ranges from about 100 nm to 1 µm, and in this case, the doping concentrations of the dopants of the doped semiconductor layer 80 range from $10^{16}$ cm$^{-3}$ to $10^{18}$ cm$^{-3}$. When the thickness T1 of the doped semiconductor layer 80 and the doping concentrations of the dopants are within the above ranges, it can be guaranteed that the doped semiconductor layer 80 can inject holes into the buffer layer 20 and/or the 2DEG area 35 and restrain current collapse. In addition, the problem that if the thickness T1 is too large, the doped semiconductor layer 80 is not easy to form is also avoided.

The semiconductor device 1a may further include a passivation layer 90. The passivation layer 90 is disposed on the barrier layer 40. In some embodiments, the passivation layer 90 may include one or more dielectric layers. The above dielectric layers include, but not limited to, oxides or nitrides, such as silicon nitride (SiN) and silicon oxide (SiO$_2$). The passivation layer 90 may include, for example but not limited to, composite layers of the oxides and the nitrides, such as Al$_2$O$_3$/SiN, Al$_2$O$_3$/SiO$_2$, AlN/SiN and AlN/SiO$_2$. In some embodiments, the passivation layer 90 may also include a flat layer. The flat layer is configured to provide a generally flat upper surface, so that a layer or a component (not shown) formed on the flat layer can be formed on the flat surface.

In some embodiments, the semiconductor device 1a may further include a field plate 100. The field plate 100 extends from the drain 72 to the gate 60. In some embodiments, the field plate 100 does not extend to an upper surface 60a of the gate 60. That is, viewing from a top view, the field plate 100 is not overlapped with the gate 60. In some embodiments, a lower surface of the field plate 100 is higher than the upper surface 60a of the gate 60. The material of the field plate 100 includes conductor materials. The conductor materials may include, for example but not limited to, metals, alloys, doped semiconductor materials (such as doped crystalline silicon) or other suitable conductor materials.

The field plate 100 extends from the drain 72 to the gate 60 by a width W1. In some embodiments, W1 ranges from about 300 nm to about 500 nm. In some embodiments, the width W1 ranges from about 500 nm to about 1 µm. In some embodiments, the width W1 ranges from about 1 µm to about 10 µm. When the width W1 is within the above ranges, an electric field of the drain 72 can be reduced, and the reliability degree of the semiconductor device 1a can be improved.

The semiconductor device 1a may further include the buffer layer 20. The buffer layer 20 is arranged between the substrate 10 and the channel layer 30. In some embodiments, the buffer layer 20 may be configured to reduce defects caused by lattice mismatch between the substrate 10 and the group III-V layer formed later. In some embodiments, the buffer layer 20 may include (but not limited to) nitrides, such as aluminum nitride (AlN) and aluminum gallium nitride (AlGaN).

Since there are defects in the buffer layer 20, the above defects will capture electrons in the 2DEG area 35, which causes increasing of the on-resistance of the semiconductor device 1a. In the embodiments of the present disclosure, when the semiconductor device 1a is in the OFF state, an electric field between the drain 72 and the substrate 10 is utilized to make the doped semiconductor layer 80 inject the holes into the buffer layer 20 and/or the 2DEG area 35 so as to eliminate electrons caught in the defects of the buffer layer 20, and accordingly, current collapse of the semiconductor device 1a is restrained.

Figure 1B:
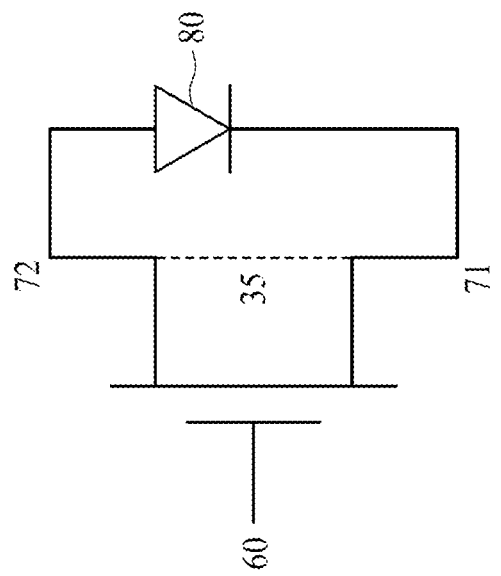
FIG. 1B shows an equivalent circuit diagram of the semiconductor device of FIG. 1A.

FIG. 1B shows an equivalent circuit diagram of the semiconductor device 1a of FIG. 1A. Referring to FIG. 1A and FIG. 1B, the doped semiconductor layer 80 is capable of serving as a diode. In the present embodiment, the semiconductor device 1a may include two current paths in parallel connection with each other. A current can flow from the drain 72 to the source 71 through the 2DEG area 35. Since the diode formed by the doped semiconductor layer 80 is in parallel connection with the 2DEG area 35, the current of the 2DEG area 35 is not affected.

In the present embodiment, when the semiconductor device 1a is in the OFF state, the doped semiconductor layer 80 can inject the holes into the 2DEG area 35, which further depletes the electrons of the 2DEG area 35 and increases the resistance of the 2DEG area 35, so that the leakage currents can be reduced, and accordingly, a breakdown voltage of the semiconductor device 1a is increased.

Figure 2:
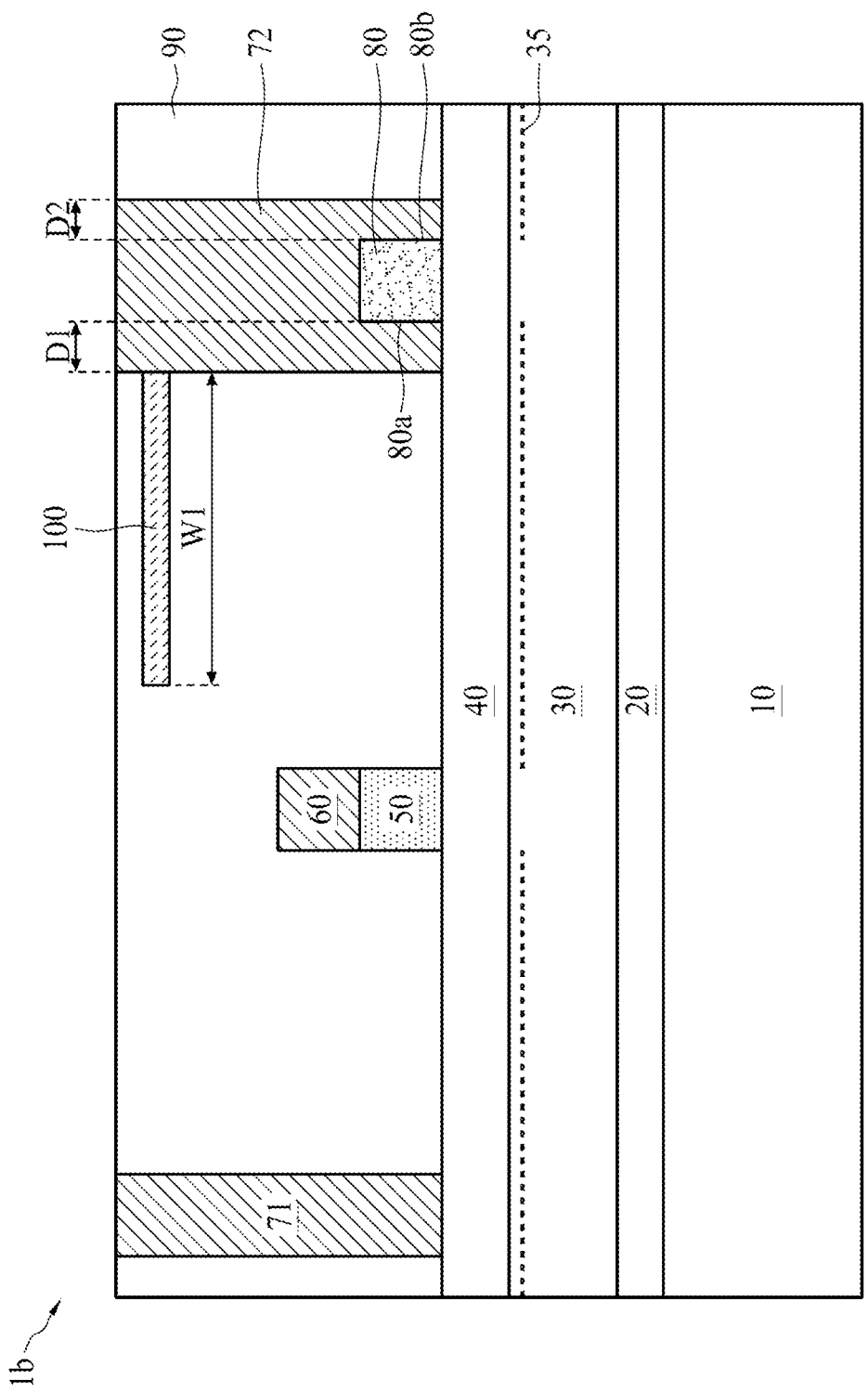
FIG. 2 shows a sectional view of a semiconductor device according to certain embodiments of the present disclosure.

FIG. 2 shows a semiconductor device 1b according to certain embodiments of the present disclosure.

The semiconductor device 1b shown in FIG. 2 may be the same as or similar to the semiconductor device 1a shown in FIG. 1. One of the differences is that a drain 72 of the semiconductor device 1b may cover a side 80b of a doped semiconductor layer 80. In some embodiments, the drain 72 makes contact with the side 80b. In some embodiments, the drain 72 directly makes contact with the side 80b.

A distance D2 is formed between a side 72b of the drain 72 away from a gate 60 and the side 80b. In some embodiments, the distance D2 ranges from about 100 nm to 200 nm. In some embodiments, the distance D2 ranges from about 200 nm to 1 μm. In some embodiments, the distance D2 ranges from about 1 μm to 20 μm. When the distance D2 is within the above ranges, it can be guaranteed that 2DEG between the gate and the drain of the semiconductor device 1b is not cut off by an electric hole released by the doped semiconductor layer 80 to affect the efficacy of the semiconductor device 1b. In some embodiments, the distance D1 is equal to the distance D2. In some embodiments, the distance D1 is unequal to the distance D2.

Figure 3:
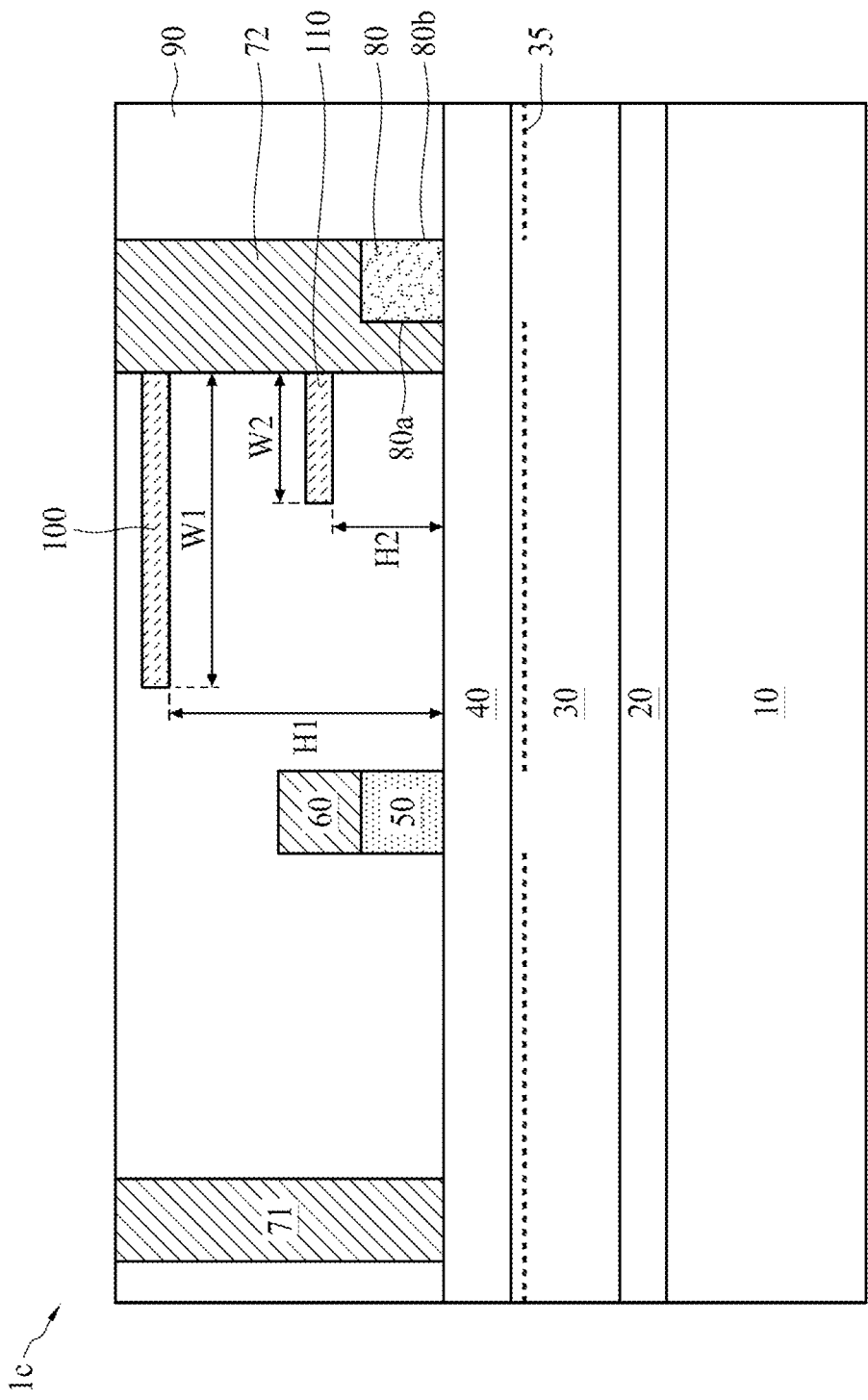
FIG. 3 shows a sectional view of a semiconductor device according to certain embodiments of the present disclosure.

FIG. 3 shows a semiconductor device 1c according to certain embodiments of the present disclosure.

The semiconductor device 1c shown in FIG. 3 may be the same as or similar to the semiconductor device 1a shown in FIG. 1. One of the differences is that the semiconductor device 1c further includes a field plate 110.

The field plate 110 extends from a drain 72 to a gate 60. In some embodiments, a field plate 100 covers the field plate 110. In some embodiments, the field plate 110 is located between the field plate 100 and a barrier layer 40. The material of the field plate 110 includes conductor materials. The conductor materials may include, for example but not limited to, metals, alloys, doped semiconductor materials (such as doped crystalline silicon) or other suitable conductor materials. The material of the field plate 110 may be the same as or different from the material of the field plate 100.

In some embodiments, the field plate 110 extends from the drain 72 to the gate 60 by a width W2. In some embodiments, the width W2 ranges from about 100 nm to about 300 nm. In some embodiments, the width W2 ranges from about 300 nm to about 500 nm. In some embodiments, the width W2 ranges from about 500 nm to about 1 μm. In some embodiments, the width W2 ranges from about 1 μm to about 5 μm. In some embodiments, the width W1 is greater than the width W2. When the width W2 is within the above ranges, an electric field near the drain 72 can be further reduced, and the reliability degree of the semiconductor device 1c can be improved.

A distance H1 is formed between the field plate 100 and the barrier layer 40. In some embodiments, the distance H1 ranges from about 50 nm to about 100 nm. In some embodiments, the distance H1 ranges from about 100 nm to about 1 μm. In some embodiments, the distance H1 ranges from about 1 μm to about 3 μm.

A distance H2 is formed between the field plate 110 and the barrier layer 40. In some embodiments, the distance H2 ranges from about 30 nm to about 100 nm of a channel layer. In some embodiments, the distance H2 ranges from about 100 nm to about 500 nm. In some embodiments, the distance H2 ranges from about 500 nm to about 1 μm.

In some embodiments, the distance H1 is greater than the distance H2. In some embodiments, the field plate 110 may be located between an upper surface 60a and a lower surface 60b of the gate 60. The field plates 100 and 110 can reduce a peak electric field near the drain of the semiconductor device 1c and improve the reliability of the semiconductor device 1c.

Figure 4:
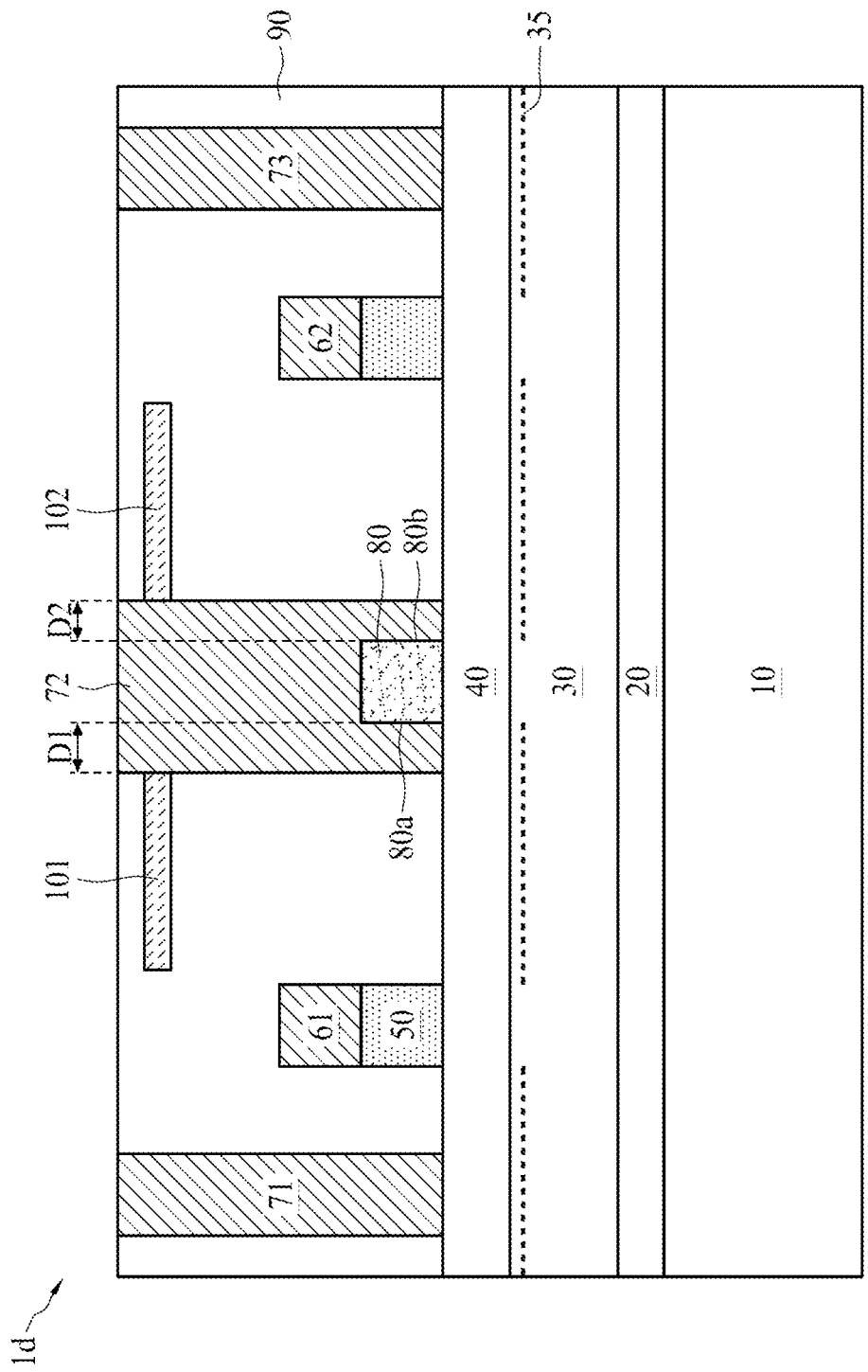
FIG. 4 shows a sectional view of a semiconductor device according to certain embodiments of the present disclosure.

FIG. 4 shows a semiconductor device 1d according to certain embodiments of the present disclosure.

The semiconductor device 1d shown in FIG. 4 may be the same as or similar to the semiconductor device 1a shown in FIG. 1. One of the differences is that the semiconductor device 1d includes a gate 61, a gate 62 and a source 73.

The materials and/or structures of the gate 61 and the gate 62 may be the same as or similar to the material and/or structure of the gate 60. The material and/or structure of the source 73 may be the same as or similar to the material and/or structure of a source 71. As shown in FIG. 4, a drain 72 is located between the gate 61 and the gate 62. In some embodiments, the drain 72 is capable of serving as a common drain. A side 80a of a doped semiconductor layer 80 is close to the gate 61. A side 80b is close to the gate 62. In some embodiments, the drain 72 covers the side 80a and the side 80b. In some embodiments, the drain 72 makes contact with the side 80a and the side 80b. In some embodiments, the drain 72 directly makes contact with the side 80a and the side 80b. In some embodiments, the doped semiconductor layer 80 is inlaid into the drain 72.

In some embodiments, the semiconductor device 1d further includes a field plate 101 and a field plate 102. The materials and/or structures of the field plate 101 and the field plate 102 may be the same as or similar to the material and/or structure of the field plate 100. The field plate 101 may extend from the drain 72 to the gate 61. The field plate 102 may extend from the drain 72 to the gate 62. In some embodiments, the field plate 101 does not extend to a position over the gate 61. In some embodiments, a lower surface of the field plate 101 is higher than an upper surface of the gate 61. In some embodiments, the field plate 102 does not extend to a position over the gate 62. In some embodiments, a lower surface of the field plate 102 is higher than an upper surface of the gate 62.

Figure 5:
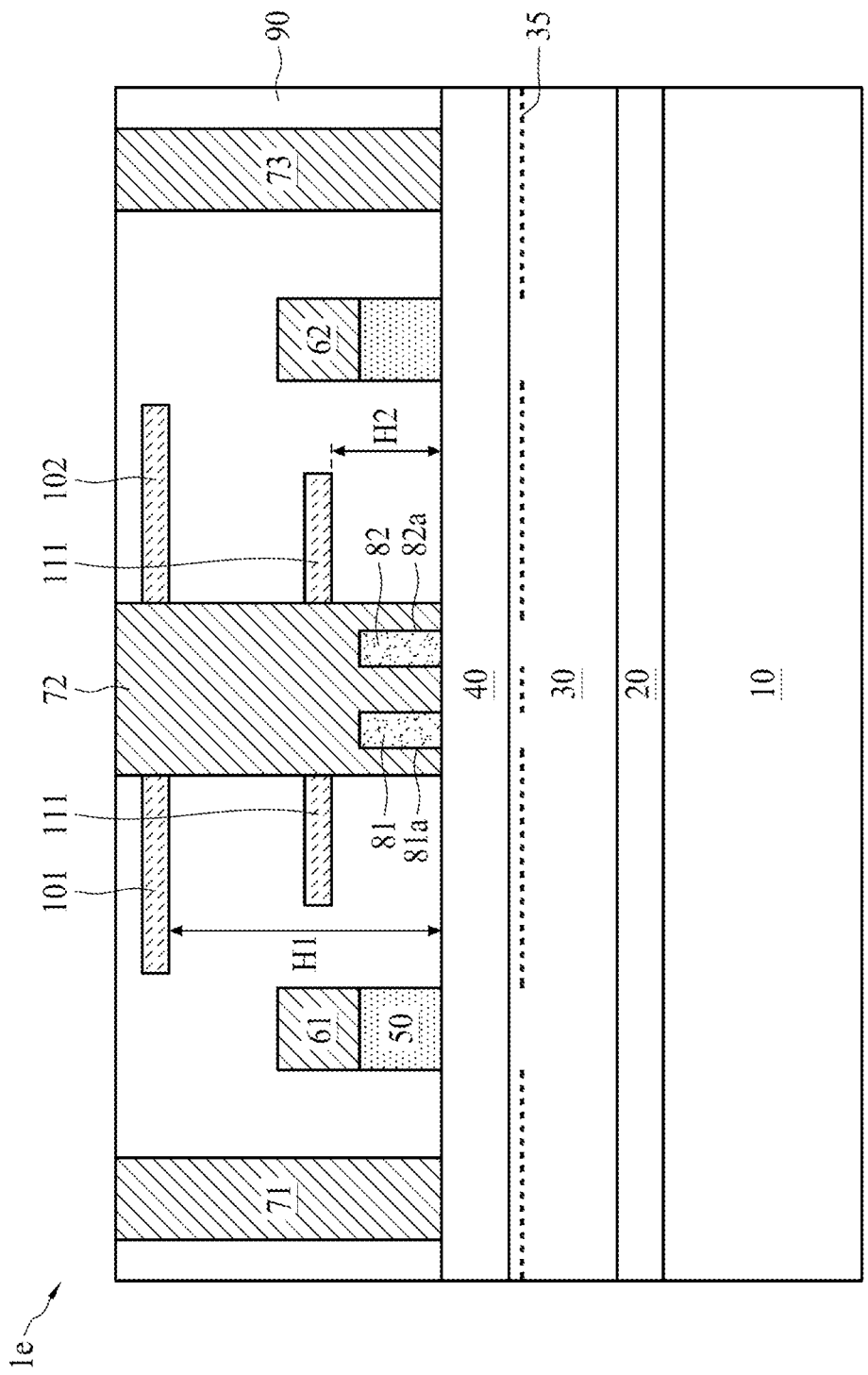
FIG. 5 shows a sectional view of a semiconductor device according to certain embodiments of the present disclosure.

FIG. 5 shows a semiconductor device 1e according to certain embodiments of the present disclosure.

The semiconductor device 1e shown in FIG. 5 may be the same as or similar to the semiconductor device 1d shown in FIG. 4. One of the differences is that the semiconductor device 1e includes a doped semiconductor layer 81 and a doped semiconductor layer 82. The materials and/or structures of the doped semiconductor layer 81 and the doped semiconductor layer 82 may be the same as or similar to the material and/or structure of the doped semiconductor layer 80. In some embodiments, the material of the doped semiconductor layer 81 is the same as that of the doped semiconductor layer 82. In some embodiments, the material of the doped semiconductor layer 81 is different from that of the doped semiconductor layer 82.

Although the semiconductor device 1e shown in FIG. 5 includes the two separated doped semiconductor layers, the semiconductor device 1e may include more doped semiconductor layers separated from one another. As shown in FIG. 5, the doped semiconductor layer 81 is provided with a side 81a close to a gate 61, and the doped semiconductor layer 82 is provided with a side 82a close to a gate 62. In some embodiments, a drain 72 covers the side 81a and the side 82a. In some embodiments, the drain 72 makes contact with the side 81a and the side 82a.

In some embodiments, the semiconductor device 1e further includes a field plate 111. The material and/or structure of the field plate 111 may be the same as or similar to the material and/or structure of the field plate 110. In some embodiments, the field plate 111 may be annular, which surrounds the drain 72.

Figure 6A:
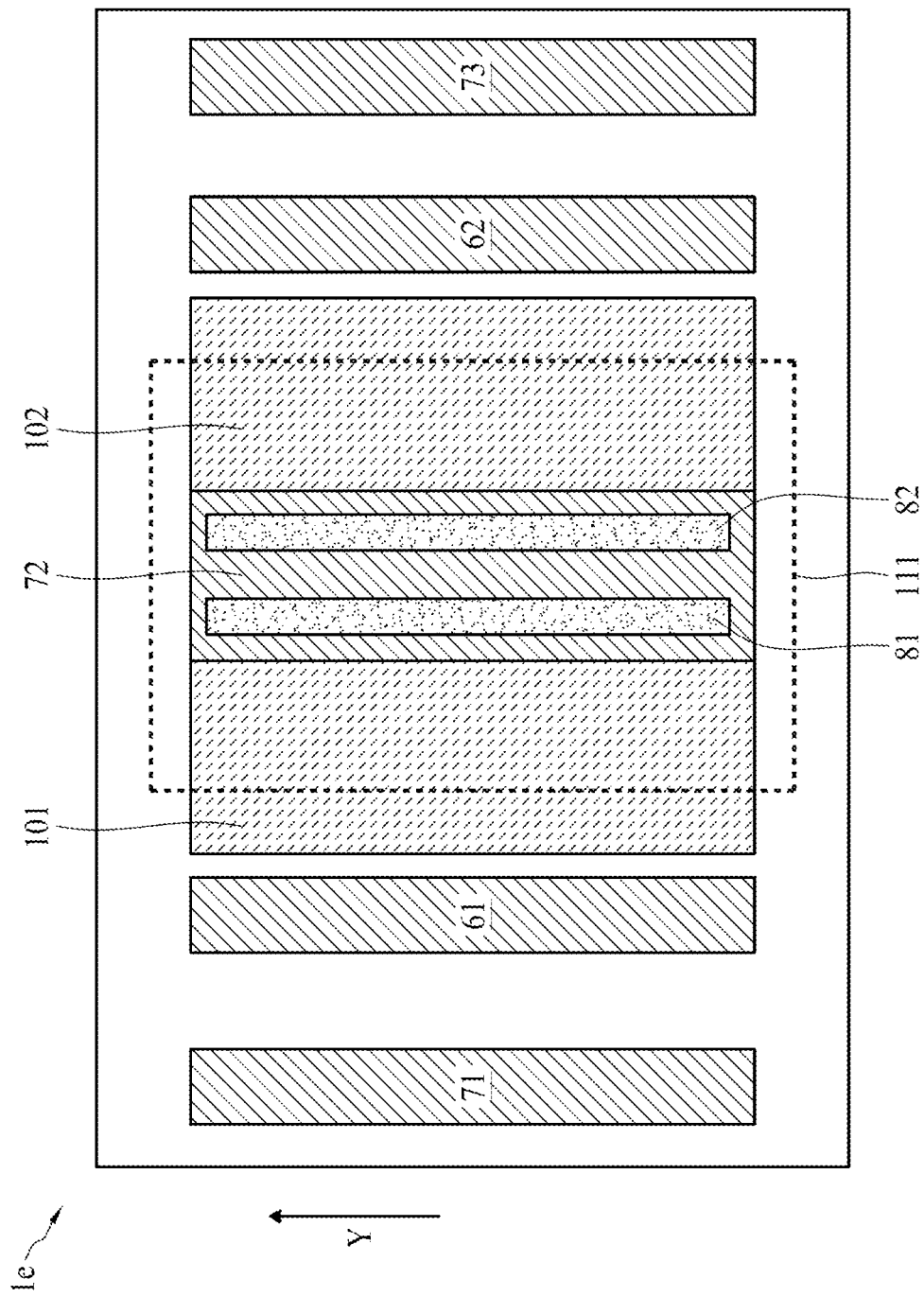
FIG. 6A shows a top view of a semiconductor device according to certain embodiments of the present disclosure.

FIG. 6A shows a top view of the semiconductor device 1*e*.

As shown in FIG. 6A, the doped semiconductor layer 81 and the doped semiconductor layer 82 can extend in one direction, such as a Y direction. In some embodiments, a field plate 101 and a field plate 102 are separated through the drain 72. The field plate 101 may be in a long strip shape and extends in the Y direction. The field plate 102 may be in a long strip shape and extends in the Y direction. In some embodiments, the field plate 111 (shown by a hidden line) surrounds the drain 72. A part of the field plate 111 is not covered with the field plate 101 and/or the field plate 102.

Figure 6B:
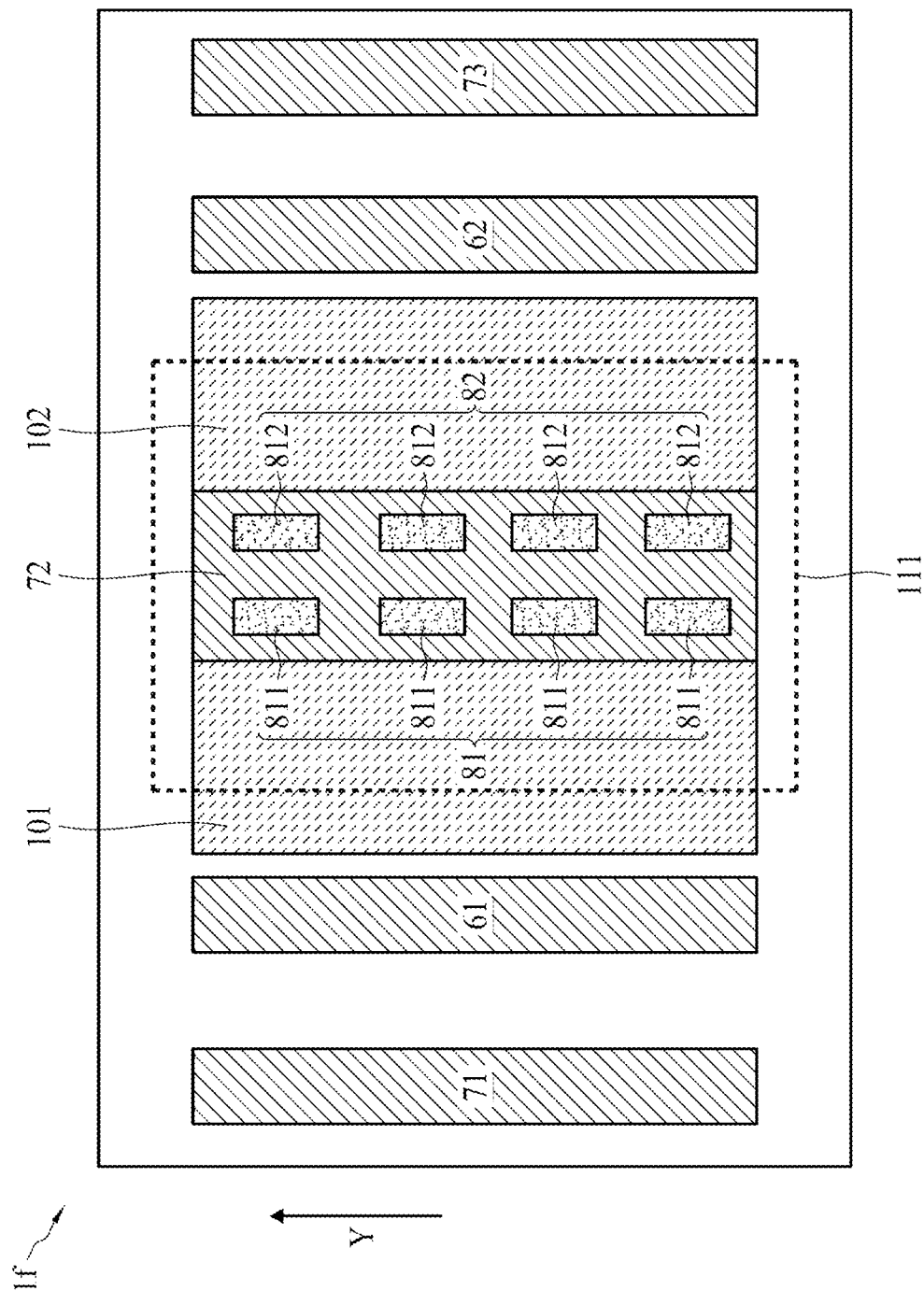
FIG. 6B shows a top view of a semiconductor device according to certain embodiments of the present disclosure.

FIG. 6B shows a top view of a semiconductor device 1*f*.

The semiconductor device if shown in FIG. 6B may be the same as or similar to the semiconductor device 1*e* shown in FIG. 6A. One of the differences is that a doped semiconductor layer 81 may include a plurality of separated parts (such as a part 811 and a part 812). The plurality of parts of the above doped semiconductor layer 81 can extend in a Y direction. A doped semiconductor layer 82 may include a plurality of separated parts. The plurality of parts of the above doped semiconductor layer 82 can be arranged in the Y direction, but the present disclosure is not limited to this.

As shown in FIG. 6B, electrons in a 2DEG area 35 below an area between the parts 811 and the parts 812 are not depleted by the doped semiconductor layer 81 so that the on-resistance of the semiconductor device if can be reduced.

In some embodiments, the doped semiconductor layer 81 and/or the shape of the doped semiconductor layer 82 may be in a strip shape, an annular shape, a circular shape or a combination of the above. In some embodiments, the outline of the doped semiconductor layer 81 may be the same as or different from that of the doped semiconductor layer 82.

Figure 7A:
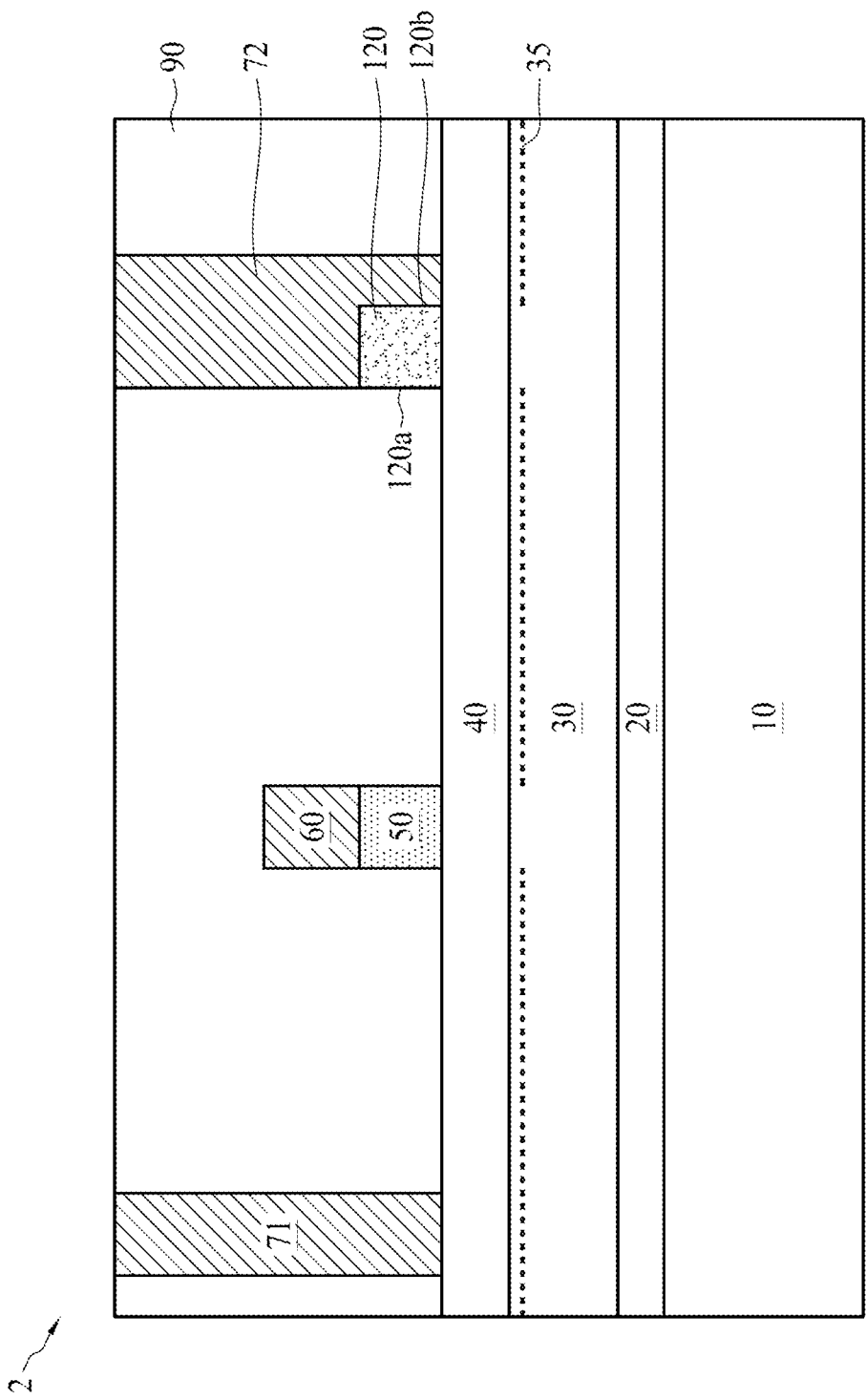
FIG. 7A shows a sectional view of a semiconductor device according to certain embodiments of the present disclosure.

FIG. 7A shows a sectional view of a semiconductor device 2 according to some embodiments of the present disclosure.

The semiconductor device 2 shown in FIG. 7A may be the same as or similar to the semiconductor device 1*a* shown in FIG. 1A. The difference thereof is that the doped semiconductor layer 80 of the semiconductor device 1*a* is replaced with a p-type doped III-V layer 120 to form the semiconductor device 2.

The p-type doped III-V layer 120 of the semiconductor device 2 and the p-type doped III-V layer 50 may be formed by the same epitaxy process. That is, the material of the p-type doped III-V layer 120 is the same as that of the p-type doped III-V layer 50. The p-type doped III-V layer 120 is crystalline p-type doped GaN. The p-type doped III-V layer 120 includes a side 120*a* close to a gate 60 and a side 120*b* away from the gate 60. In some embodiments, the side 120*a* does not make contact with a drain 72. The side 120*a* is not covered with the drain 72. The side 120*b* makes contact with the drain 72.

Figure 7B:
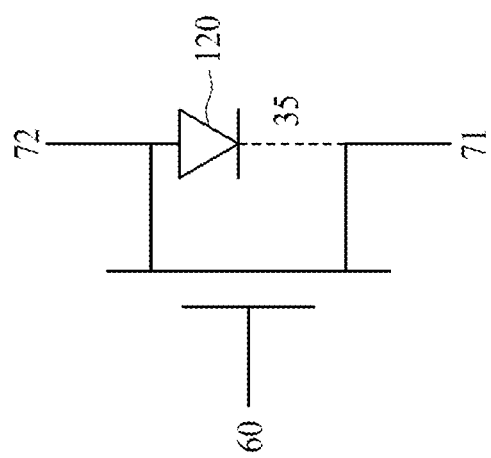
FIG. 7B shows an equivalent circuit diagram of the semiconductor device of FIG. 7A.

FIG. 7B shows an equivalent circuit diagram of the semiconductor device of FIG. 7A.

As shown in FIG. 7B, the p-type doped III-V layer 120 is capable of serving as a diode. When the semiconductor device 2 is switched on, a current can flow from the drain 72 to a source 71 through the p-type doped III-V layer 120 and a 2DEG area 35. In the present embodiment, the drain 72, the p-type doped III-V layer 120, the 2DEG area 35 and the source 71 may be regarded as current paths in series connection. Therefore, compared with the embodiment of FIG. 1A and FIG. 1B, the p-type doped III-V layer 120 of FIG. 7A and FIG. 7B may increase a channel resistance, which makes the on-resistance of the device be increased.

Figure 8:
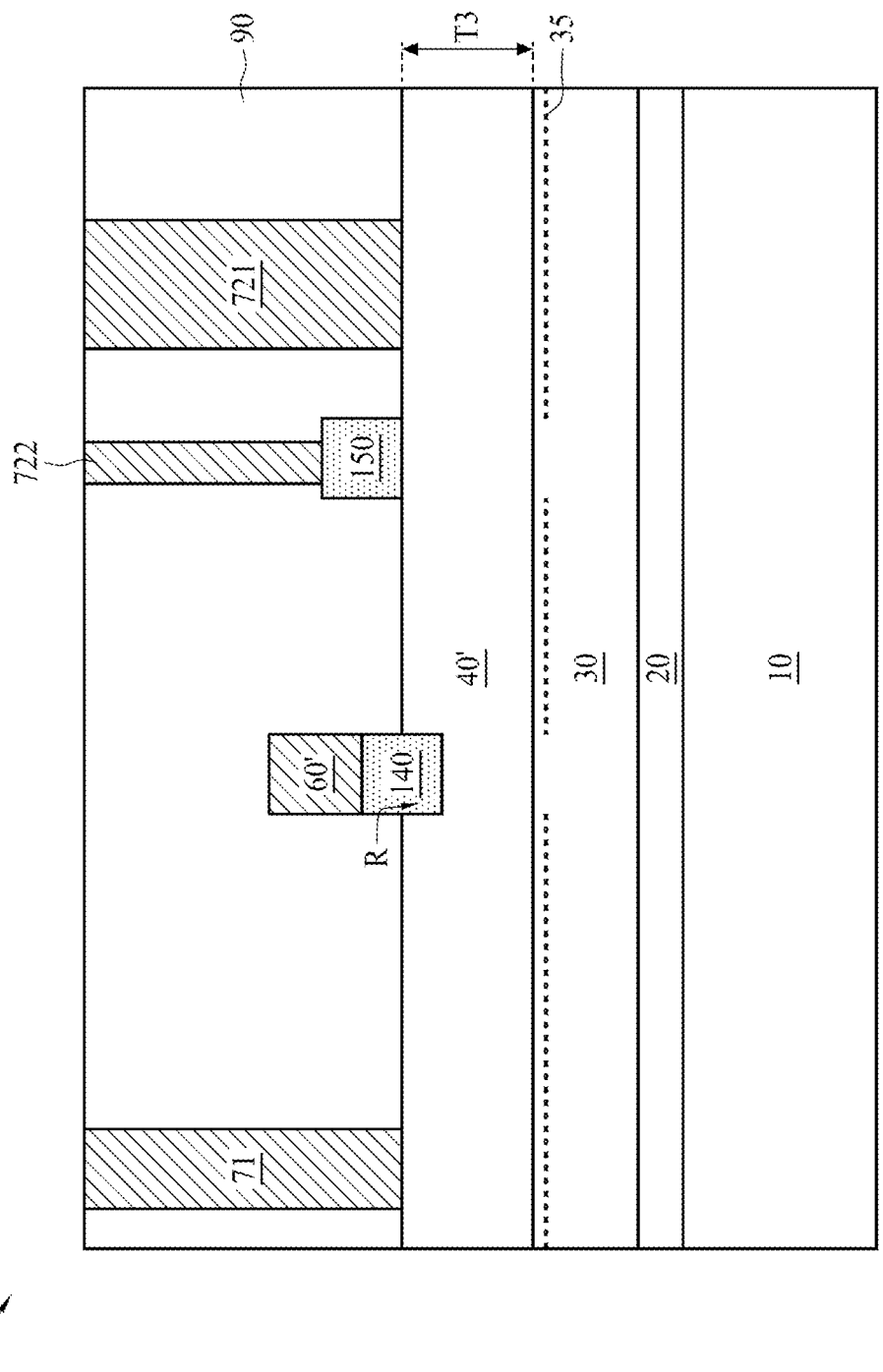
FIG. 8 shows a sectional view of a semiconductor device according to a comparative example.

FIG. 8 shows a sectional view of a semiconductor device 3 according to a comparative example.

As shown in FIG. 8, the semiconductor device 3 includes a first drain 721 and a second drain 722. The first drain 721 is electrically connected to the second drain 722. The semiconductor device 3 also includes a p-type doped III-V layer 140 and a p-type doped III-V layer 150. In the comparative example, the p-type doped III-V layer 140 and the p-type doped III-V layer 150 may be p-GaN. In the comparative example, the p-type doped III-V layer 150 is electrically connected with the second drain 722. In order to avoid the situation that the p-type doped III-V layer 150 depletes electrons in a 2DEG area below, which causes increase of Rst-on, a barrier layer 40' needs to have a larger thickness. In the comparative example, the thickness T3 of the barrier layer 40' ranges from 60 nm to 100 nm. Since the barrier layer 40' is thickened, the semiconductor device 3 in the comparative example has a recess R, so that a gate 60' is closer to a channel layer 30. Thus, even if the barrier layer 40' is thickened, the ability of the gate 60' to control the semiconductor device 3 to be started and stopped is not weakened relatively. However, in order to form the above recess R, the p-type doped III-V layer 140 needs to be formed through a secondary epitaxy process.

Since the recess R needs to be formed through an etching process during manufacturing of the semiconductor device 3 and the p-type doped III-V layer 140 needs to formed on the barrier layer 40' located in the depression through the secondary epitaxy process, residue of an etching agent is prone to existing between the p-type doped III-V layer 140 and the barrier layer 40', which results in that the barrier layer 40' and the p-type doped III-V layer 140 are polluted by the residue. According to the above, it can be known that secondary epitaxy has large technical challenges, and the preparation cost is high.

The material of the doped semiconductor layer 80, 81 or 82 of the semiconductor devices shown in FIG. 1A, FIG. 2, FIG. 3, FIG. 4, FIG. 5, FIG. 6A and FIG. 6B may have more selections. For example, the doped semiconductor layer may be formed by processes such as a deposition process and an ion implantation process. In addition, since the doped semiconductor layer 80, 81 or 82 does not cut off the 2DEG between the drain 72 and the gate 60, the barrier layer 40 of the present disclosure may be thinner, and the barrier layer 40 does not need to form a depression through the etching process. Therefore, the p-type doped III-V layer 50 and the channel layer 30 as well as the barrier layer 40 may be formed in the same cavity, while the p-type doped III-V layer 50 can be formed only through one time of epitaxy (a secondary epitaxy technology does not need to be used).

FIG. 9A, FIG. 9B, FIG. 9C and FIG. 9D show a plurality of operations for manufacturing the semiconductor device 1*a* according to certain embodiments of the present disclosure.

Figure 9A:
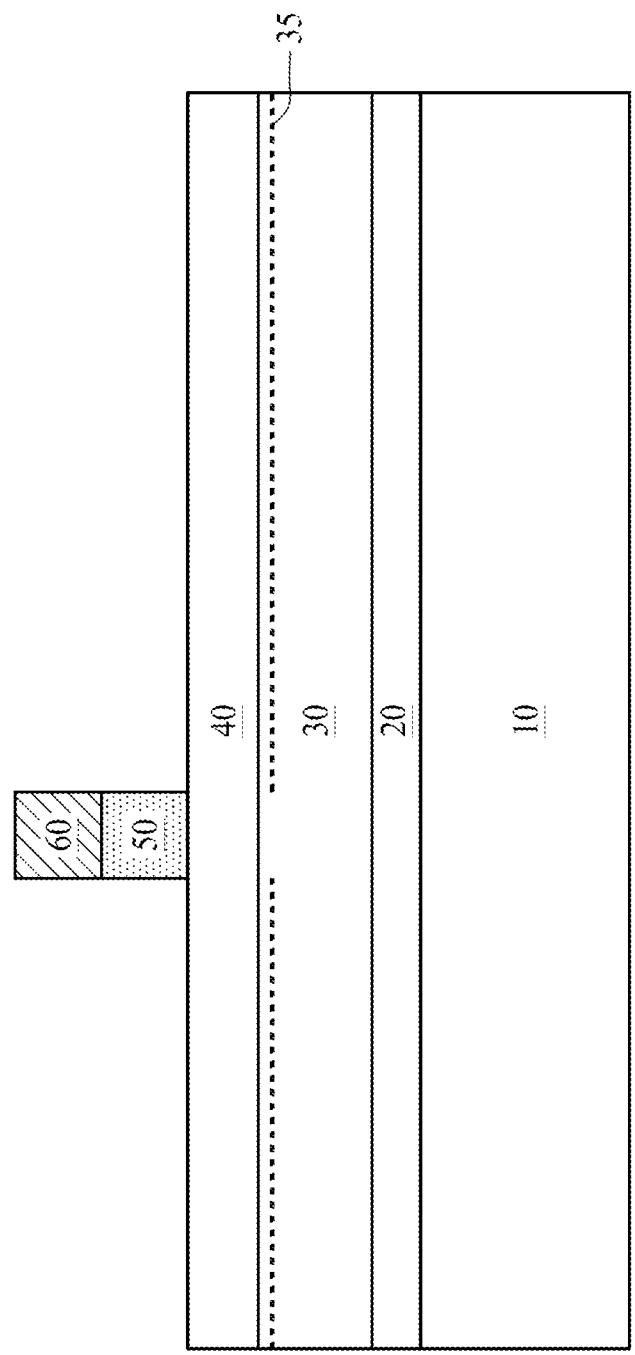
FIG. 9A, FIG. 9B, FIG. 9C and FIG. 9D show a plurality of operations for manufacturing a semiconductor device according to certain embodiments of the present disclosure.

Referring to FIG. 9A, the substrate 10 is provided, and the buffer layer 20, the channel layer 30 and the barrier layer 40 are formed on the substrate 10. The buffer layer 20, the channel layer 30 and/or the barrier layer 40, for example, may be formed through metal organic chemical vapor deposition (MOCVD), epitaxial growth or other suitable deposition steps.

Then, a p-type III-V material layer, one or more gate material layers and/or other material layers are deposited. After the above material layers are patterned, the p-type III-V layer 50 and the gate 60 are formed. The p-type III-V layer 50 may be formed through the epitaxy process. The gate material layers may be formed by depositing one or more layers of materials through physical vapor deposition (PVD), chemical vapor deposition (CVD) and/or other suitable processes.

Figure 9B:
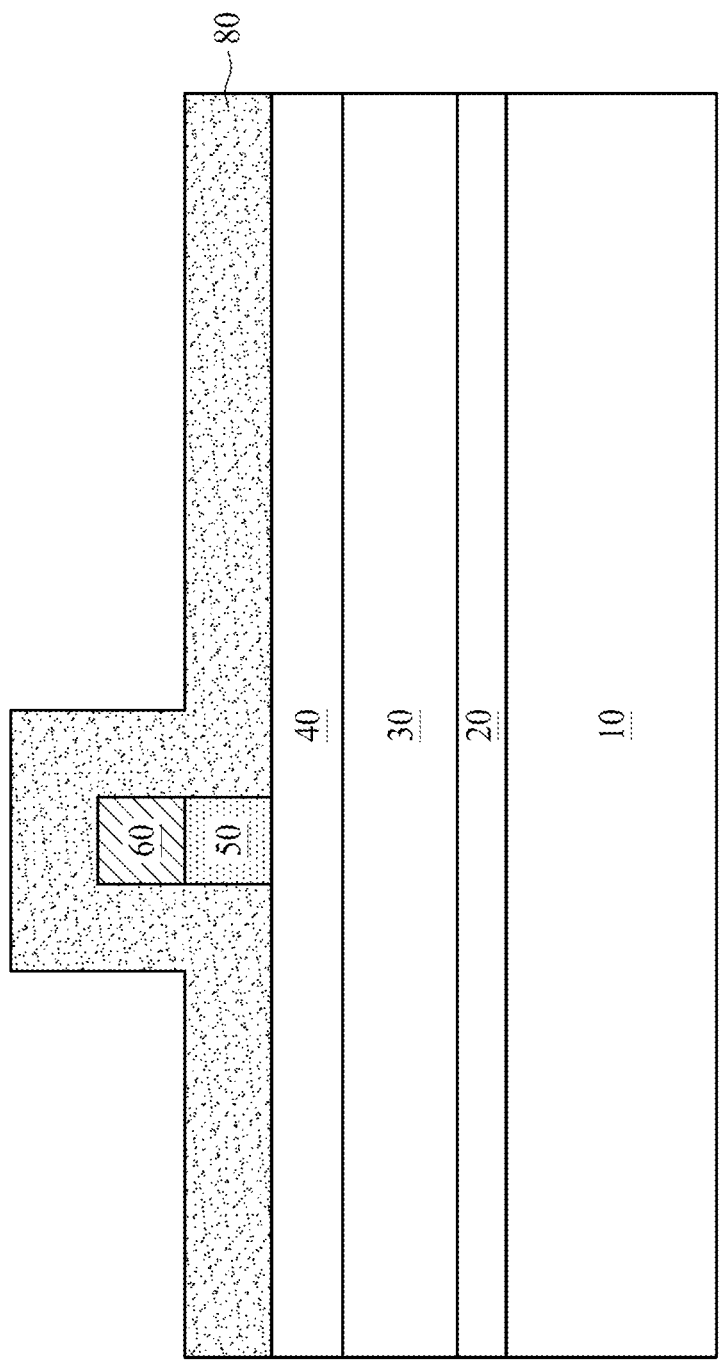

Referring to FIG. 9B, in some embodiments, the doped semiconductor layer 80 may be formed through the deposition process to cover the barrier layer 40 and the gate 60. The deposition process includes MOCVD, PVD, CVD, atomic layer deposition (ALD) and/or other suitable processes.

Figure 9C:
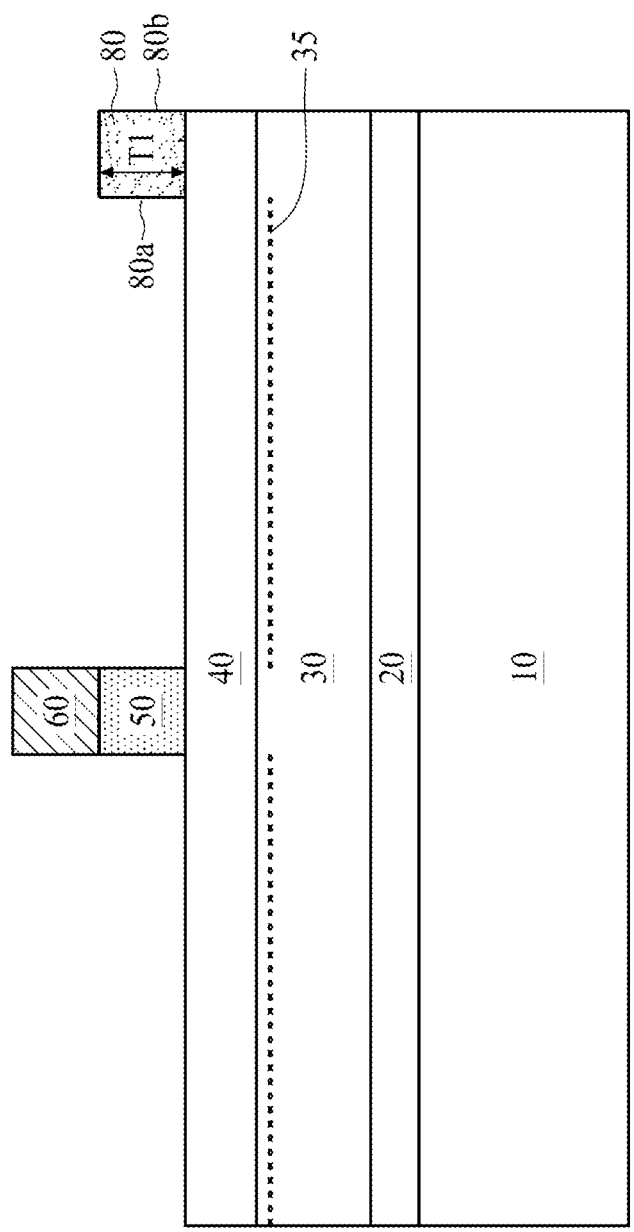

Referring to FIG. 9C, a patterning process is performed to pattern the doped semiconductor layer 80, so that the doped semiconductor layer is provided with the side 80a close to the gate 60 and the side 80b away from the gate 60. The patterning process may include photolithography, etching and/or other processes.

Figure 9D:
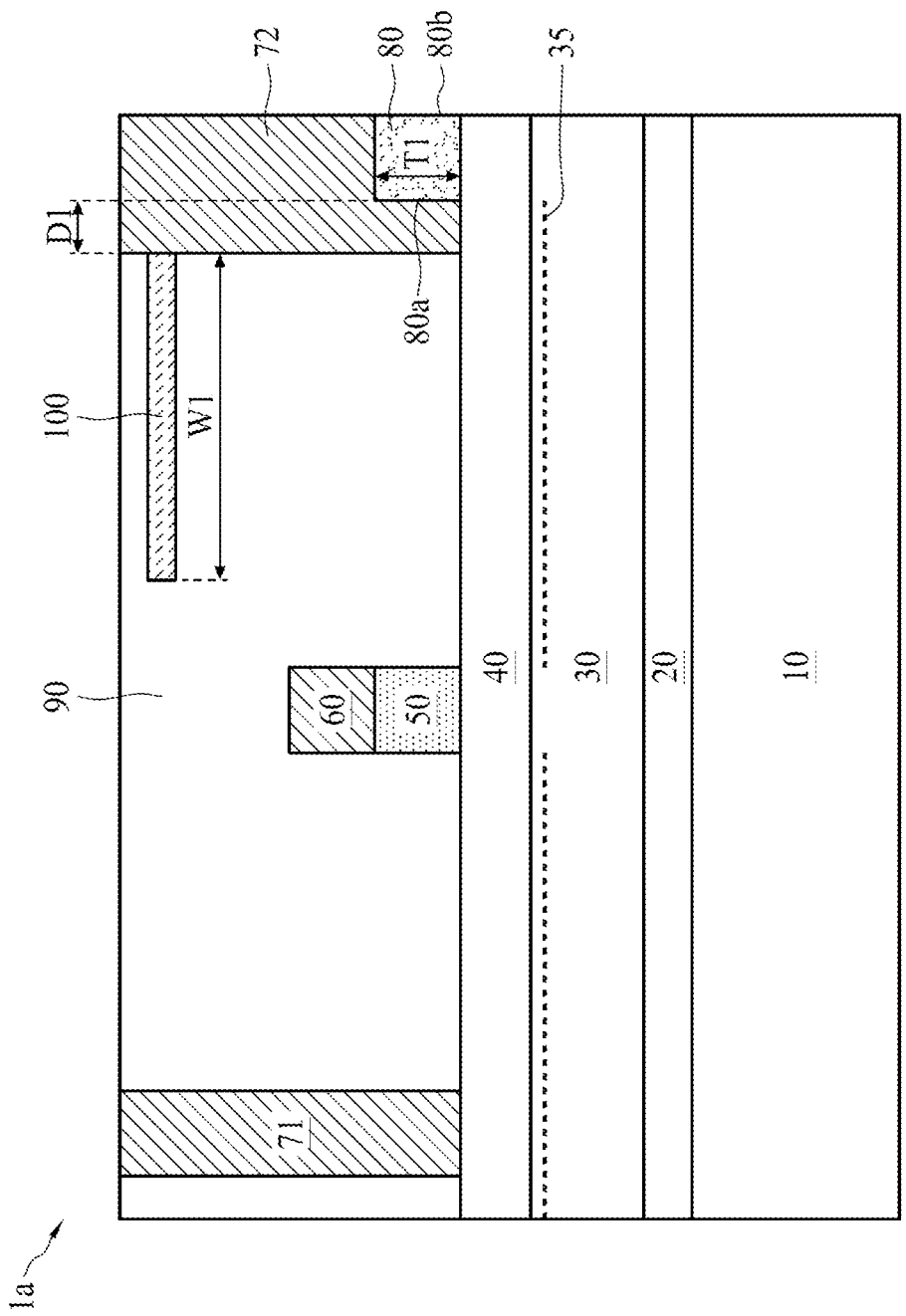

Referring to FIG. 9D, the source 71, the drain 72, the passivation layer 90 and the field plate 100 are formed to manufacture the semiconductor device 1a. The forming sequence of the above components is not limited and can be adjusted according to actual conditions. For example, a dielectric material may be deposited firstly. The dielectric material may be formed through modes such as CVD, high density plasma (HDP) CVD, spin-on and sputtering.

Then, a part of the dielectric material is removed to form an opening through one or more etching processes. After being formed, the opening can be filled with conductive materials through deposition steps such as CVD, PVD and electroplating. In some embodiments, after the opening is filled with the materials, the deposited materials are further etched again through a photomask, and required electrode structures are formed so as to form the source 71 and the drain 72. The source 71 and the drain 72 may be formed through sputtering coating, PVD or other suitable processes. In some embodiments, the conductive materials and the barrier layer 40 will form an intermetallic compound through rapid thermal anneal (RTA) to form ohmic contacts. In some embodiments, the source 71, the drain 72 and/or the field plate 100 may be formed through one or more processes.

The dielectric material may be deposited after the source 71, the drain 72 and the field plate 100 are formed. Through a chemical mechanical polishing process, an upper surface of the dielectric material is flattened to form the passivation layer 90. The above processes are only examples and are not used to limit the invention of the present disclosure.

Figure 10A:
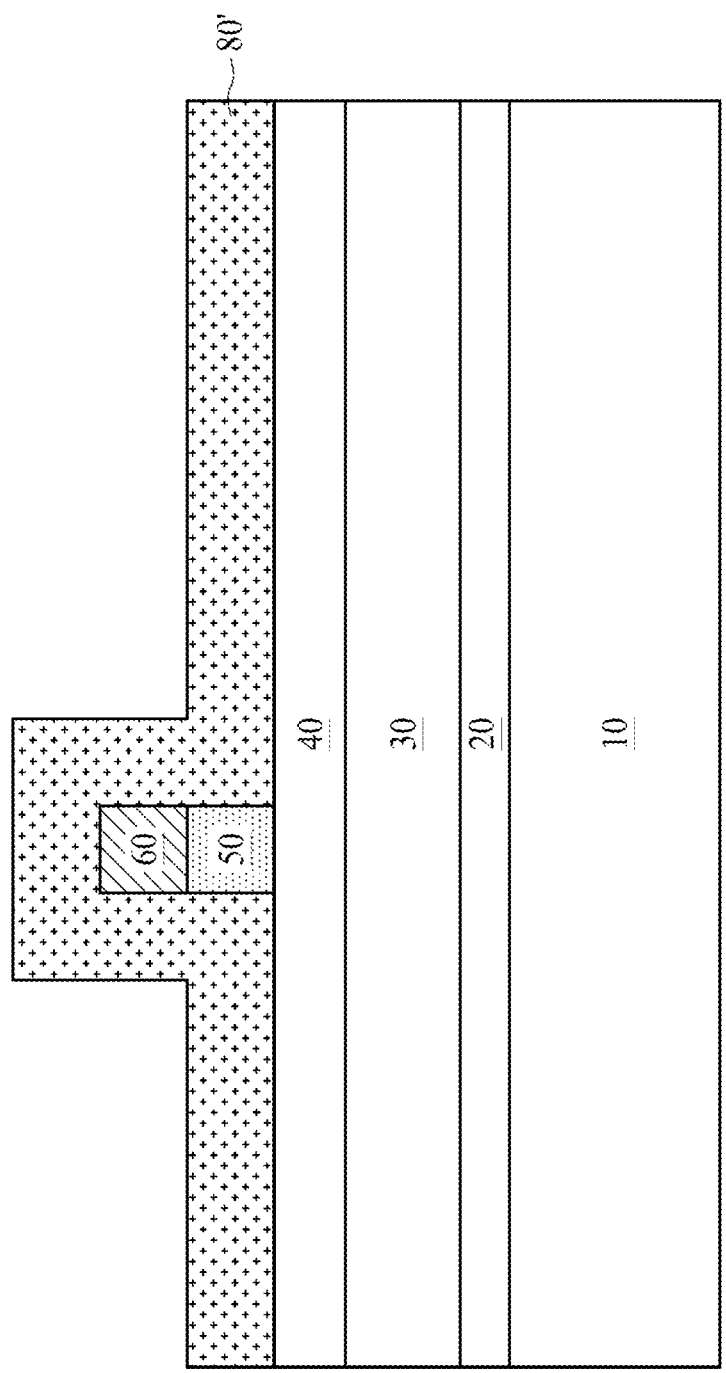
FIG. 10A, FIG. 10B and FIG. 10C show a plurality of operations for manufacturing a semiconductor device according to some embodiments of the present disclosure.
Figure 10B:
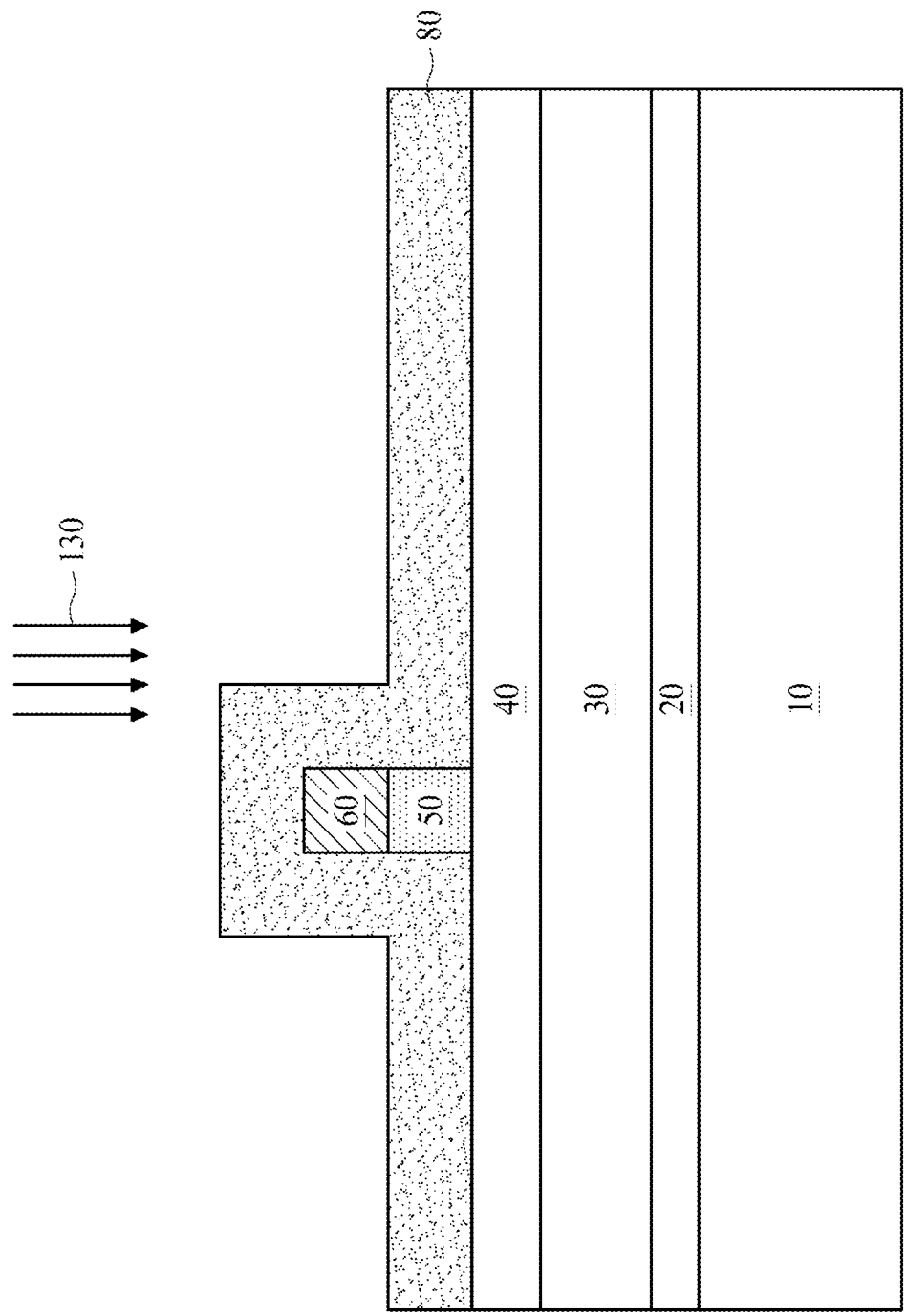
Figure 10C:
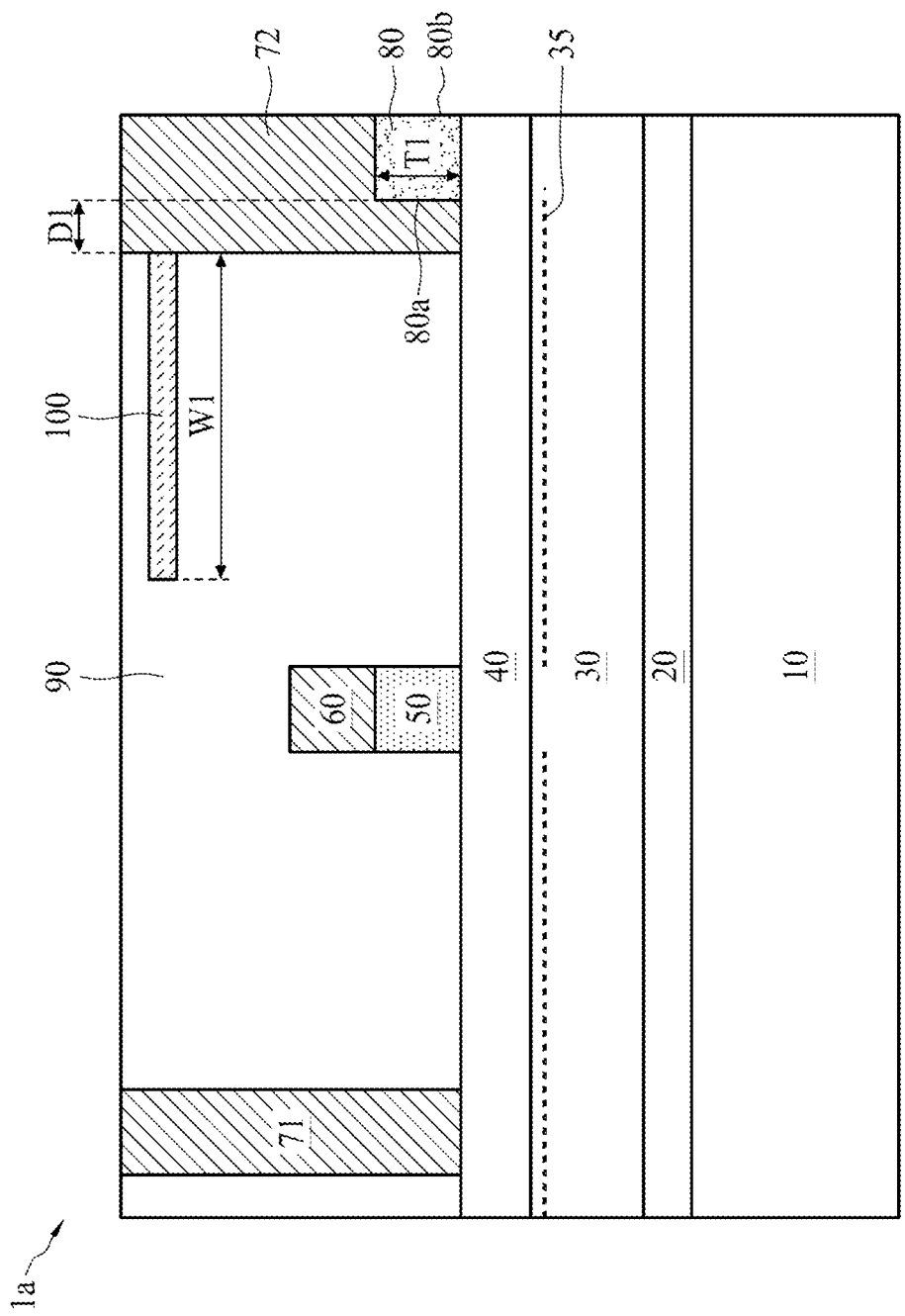

FIG. 10A, FIG. 10B and FIG. 10C show a plurality of operations for manufacturing the semiconductor device 1a according to certain embodiments of the present disclosure.

Referring to FIG. 10A, a semiconductor layer 80' can be deposited to cover the barrier layer 40 and the gate 60 after a process stage proceeds to a stage of FIG. 8A. A depositing process includes MOCVD, PVD, CVD, ALD and/or other suitable processes. In some embodiments, the material of the semiconductor layer 80' includes GaN, AlGaN, Si, $NiO_x$, $Cu_2O$, GaAs or a combination of the above.

Referring to FIG. 10B, an ion implantation process 130 is performed to implant dopants into the semiconductor layer 80' so as to form the doped semiconductor layer 80, and then the doped semiconductor layer 80 is patterned. The above dopants may be p-type dopants which include, but not limited to, magnesium (Mg), zinc (Zn), cadmium (Cd), silicon (Si) and germanium (Ge).

Referring to FIG. 10C, the source 71, the drain 72, the passivation layer 90 and the field plate 100 are formed to manufacture the semiconductor device 1a. The forming sequence of the above components is not limited and can be adjusted according to actual conditions.

In some embodiments, a p-type III-V material layer may be also formed through an epitaxy process and patterned to form the p-type doped III-V layer 50 and the doped semiconductor layer 80 simultaneously.

According to some embodiments of the present disclosure, the doped semiconductor layer may be formed, and one side of the doped semiconductor layer close to the gate is covered with the drain or makes contact with the drain, and in this way, the hole is injected into the 2DEG area 35 to deplete the electrons in the 2DEG area 35 and increase the breakdown voltage of the semiconductor device. According to some embodiments of the present disclosure, the doped semiconductor layer and the p-type III-V material layer may be formed by different processes. Therefore, the elasticity and allowance of the processes are improved.

Figure 11A:
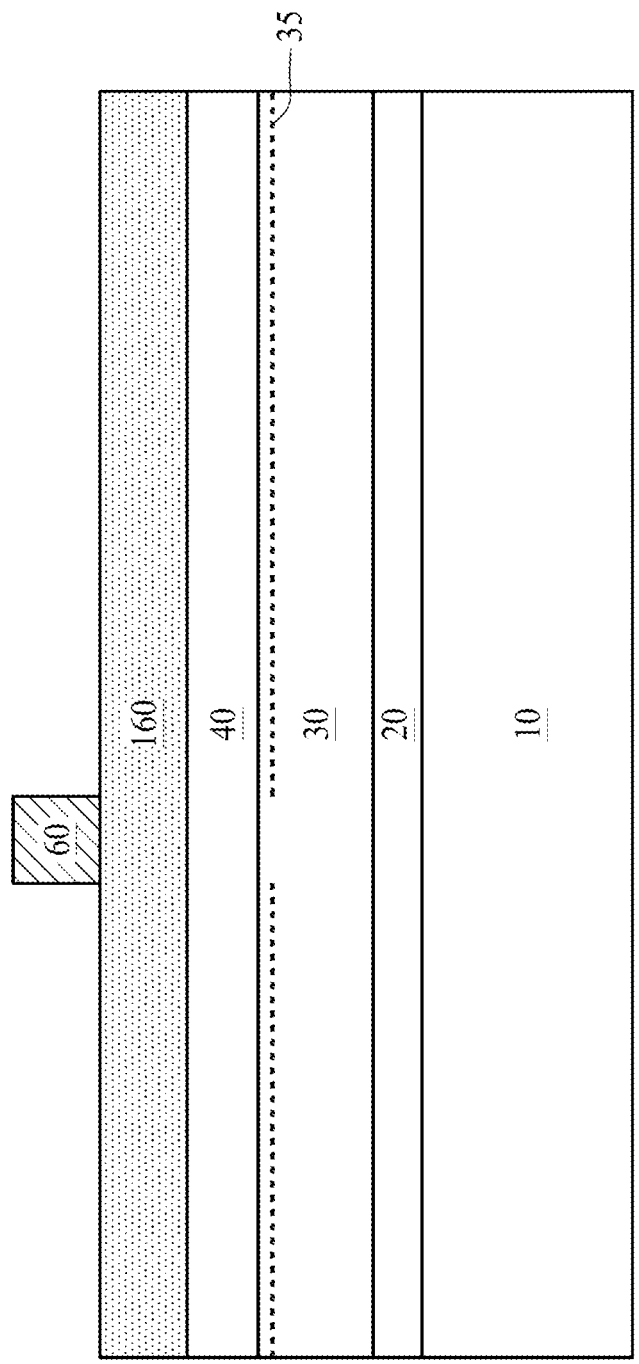
FIG. 11A, FIG. 11B and FIG. 11C show a plurality of operations for manufacturing a semiconductor device according to certain embodiments of the present disclosure.
Figure 11B:
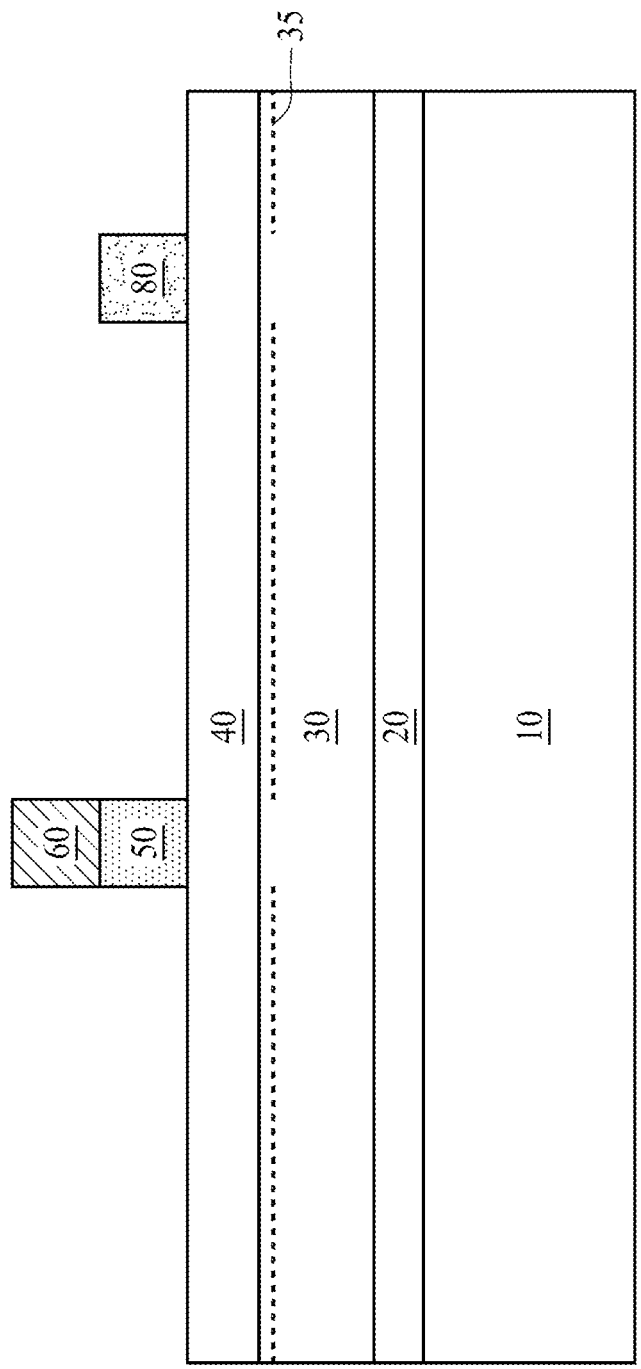
Figure 11C:
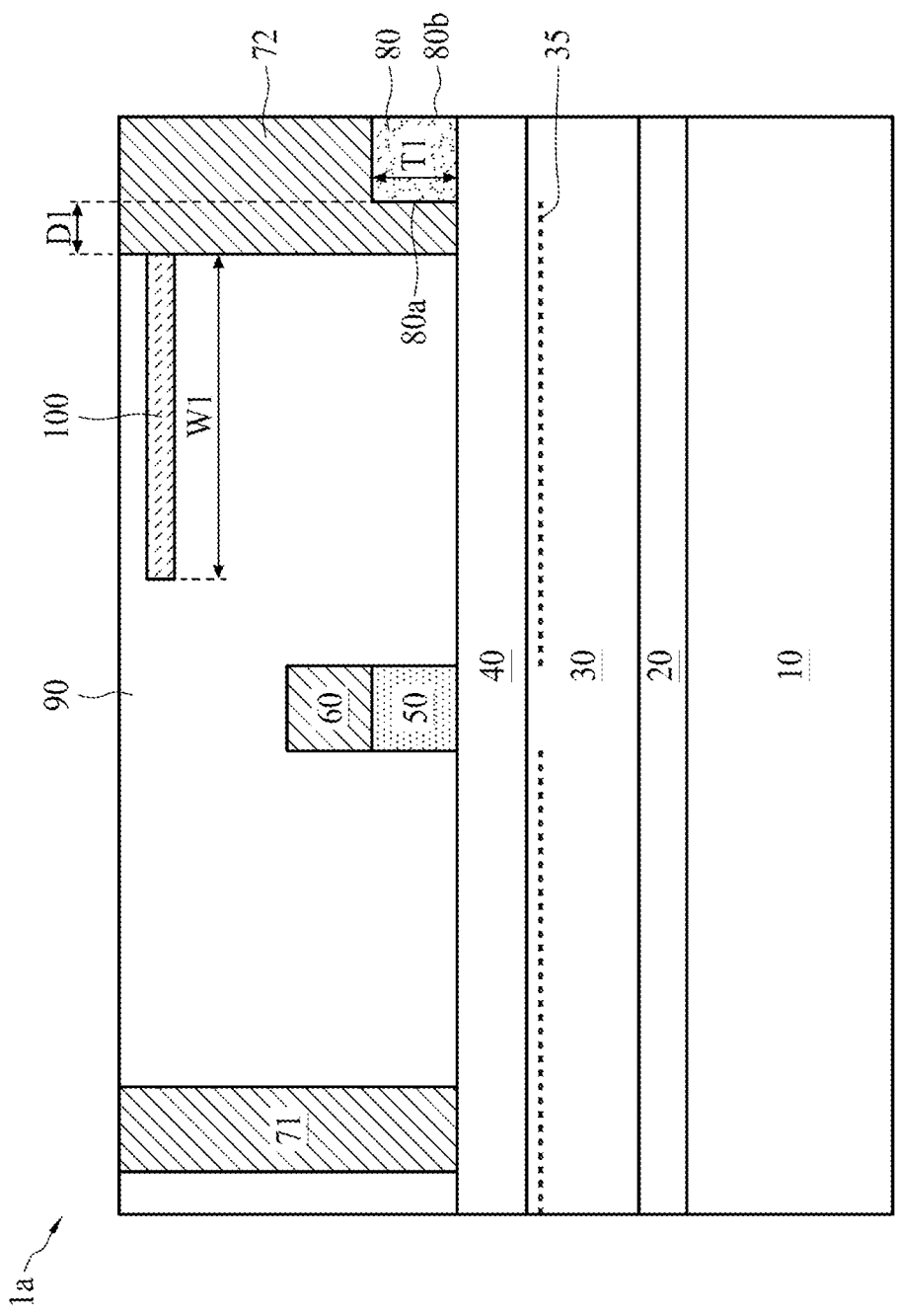

FIG. 11A, FIG. 11B and FIG. 11C show a plurality of operations for manufacturing the semiconductor device 1a according to certain embodiments of the present disclosure.

Referring to FIG. 11A, in some embodiments, the channel layer 30, the barrier layer 40 and a p-type doped III-V material 160 may be formed in the same cavity. Then, the gate 60 is formed on the p-type doped III-V material 160.

Referring to FIG. 11B, the p-type doped III-V material 160 is patterned through an etching process to form the p-type doped III-V layer 50 and the doped semiconductor layer 80. In the present embodiment, the p-type doped III-V layer 50 and the doped semiconductor layer 80 are made of the same material, such as p-GaN.

Referring to FIG. 11C, the source 71, the drain 72, the passivation layer 90 and the field plate 100 are formed to manufacture the semiconductor device 1a.

In the present embodiment, the etching process may be used to form the p-type doped III-V layer 50 and the doped semiconductor layer 80, which simplifies the process of forming the semiconductor device 1a.

FIG. 12A, FIG. 12B, FIG. 12C and FIG. 12D show a plurality of operations for manufacturing a semiconductor device 1g according to certain embodiments of the present disclosure.

Figure 12A:
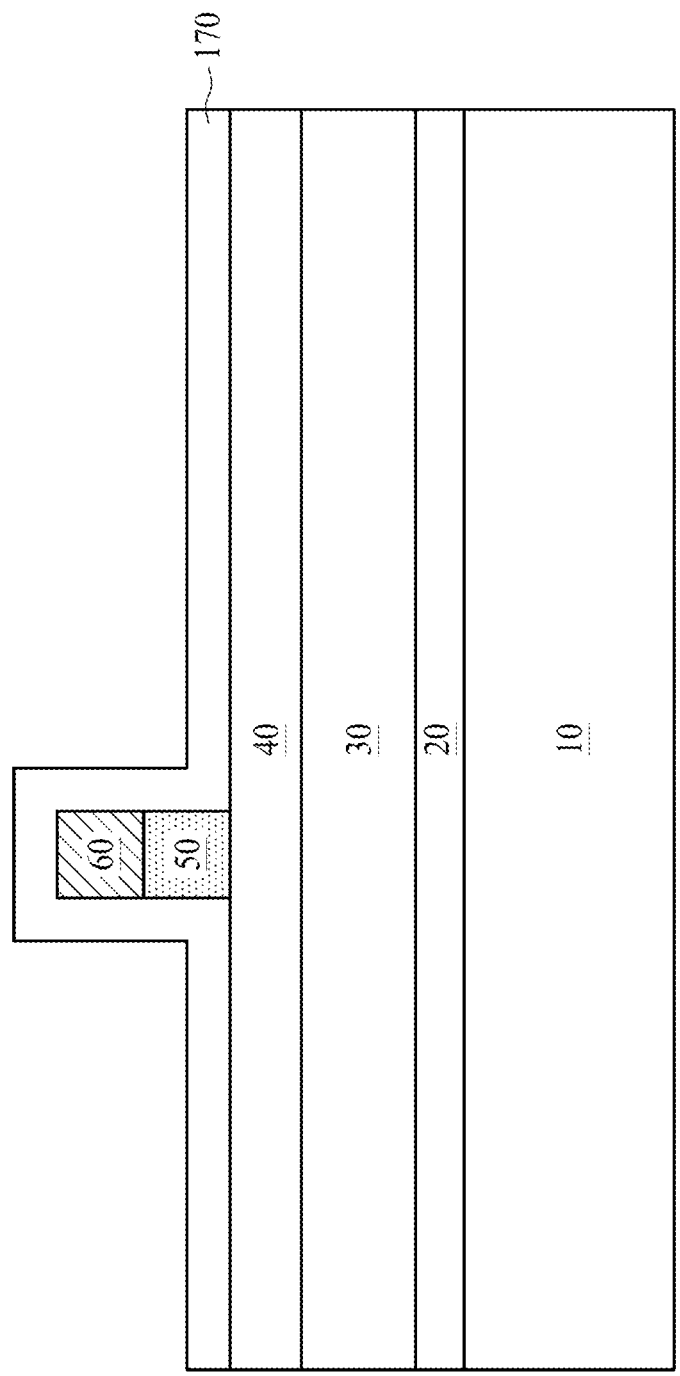
FIG. 12A, FIG. 12B, FIG. 12C and FIG. 12D show a plurality of operations for manufacturing a semiconductor device according to some embodiments of the present disclosure.

Referring to FIG. 12A, after the process stage proceeds to the stage of FIG. 8A, a sacrificial layer 170 may be deposited to cover a barrier layer 40 and a gate 60. A deposition process includes PVD, CVD, ALD and/or other suitable processes. In some embodiments, the material of the sacrificial layer 170 includes a nitride, an oxide, a nitric oxide or a combination of the above. In some embodiments, the material of the sacrificial layer 170 includes $SiO_2$. When a p-type doped III-V layer 50 is etched later, the sacrificial layer can protect the barrier layer 40 to reduce damage of the etching agent to the barrier layer 40 and avoid degradation of the semiconductor device.

Figure 12B:
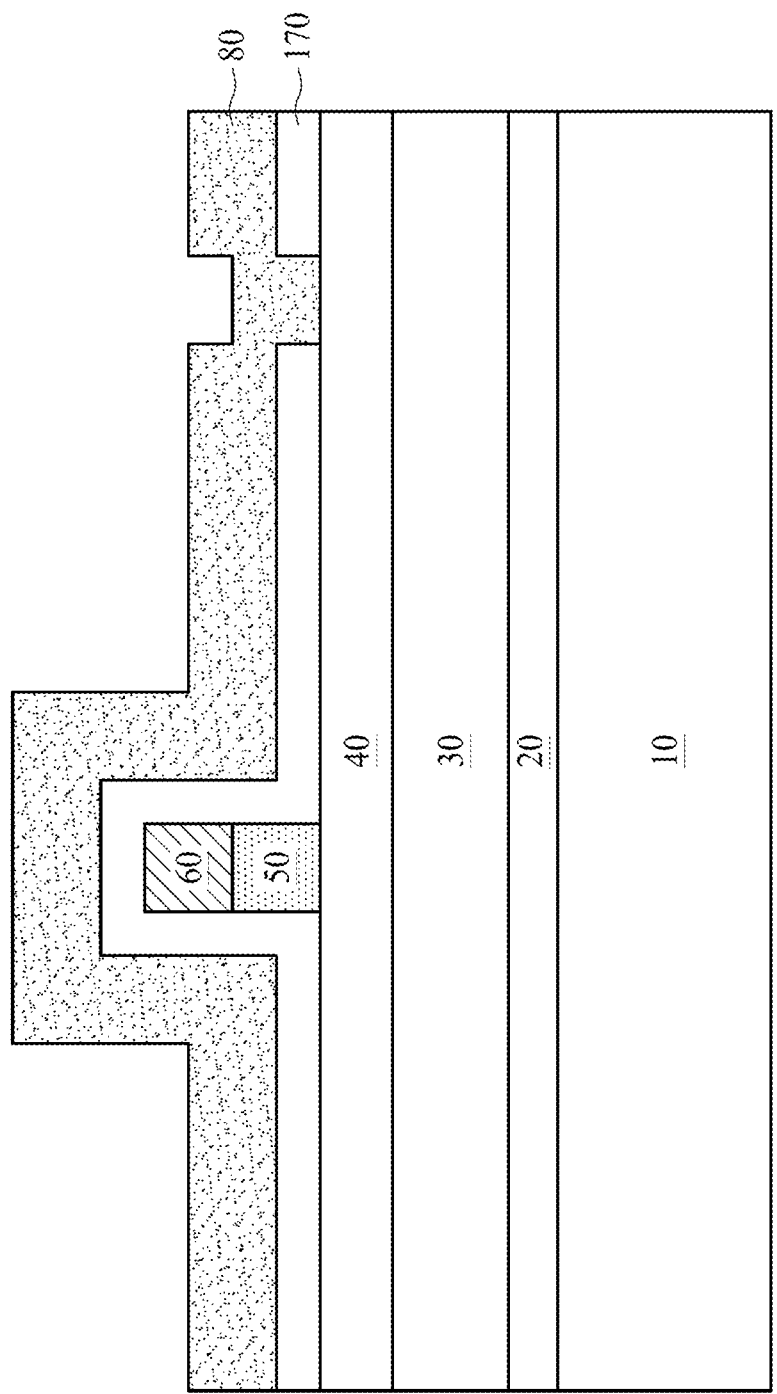

Referring to FIG. 12B, in some embodiments, the sacrificial layer 170 is patterned to make the sacrificial layer 170 be provided with an opening to expose the barrier layer 40. Then, a doped semiconductor layer 80 is formed through the deposition process to cover the sacrificial layer 170. In addition, the opening is filled with the doped semiconductor layer 80 to cover the barrier layer 40.

Figure 12C:
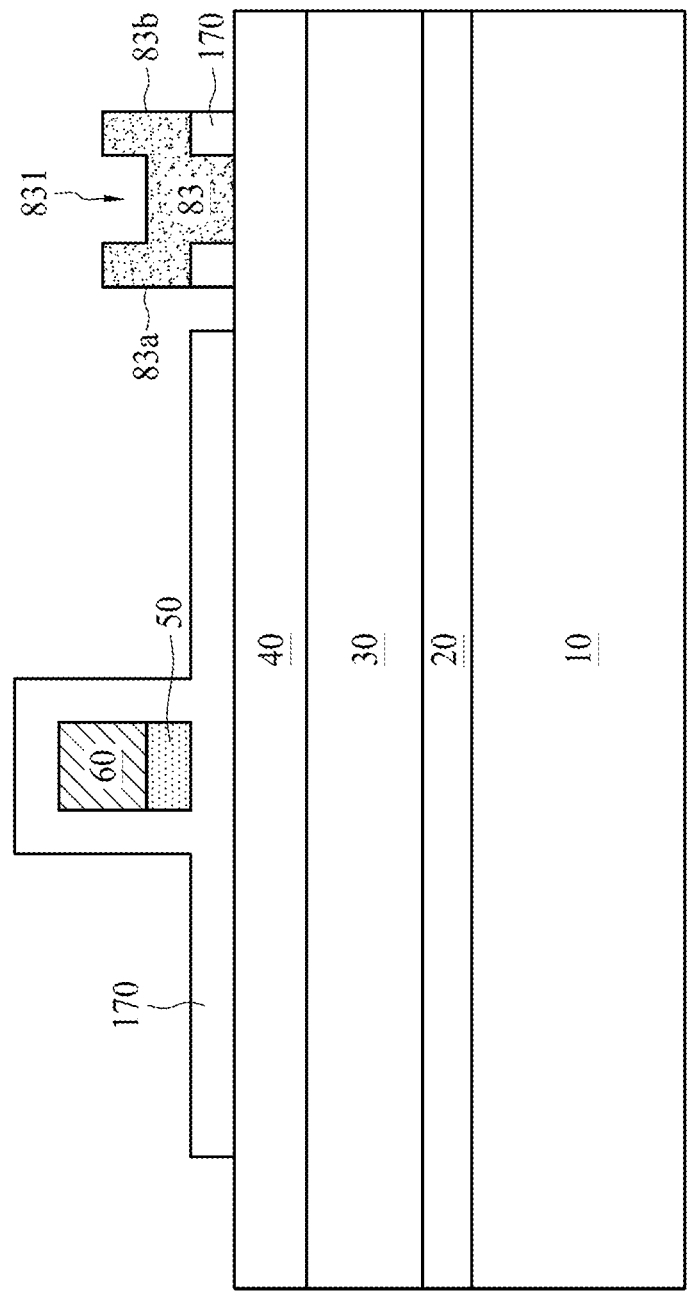

Referring to FIG. 12C, a patterning process is performed to pattern the sacrificial layer 170 and/or the doped semiconductor layer 80 so as to form a doped semiconductor layer 83. The patterning process may include one or more etching and/or lithography processes. As shown in FIG.

12C, the doped semiconductor layer 83 is provided with a side 83a close to a gate 60 and a side 83b away from the gate 60.

In some embodiments, the doped semiconductor layer 83 is provided with a depression 831. In some embodiments, a part of the sacrificial layer 170 is arranged between the doped semiconductor layer 83 and the barrier layer 40.

Figure 12D:
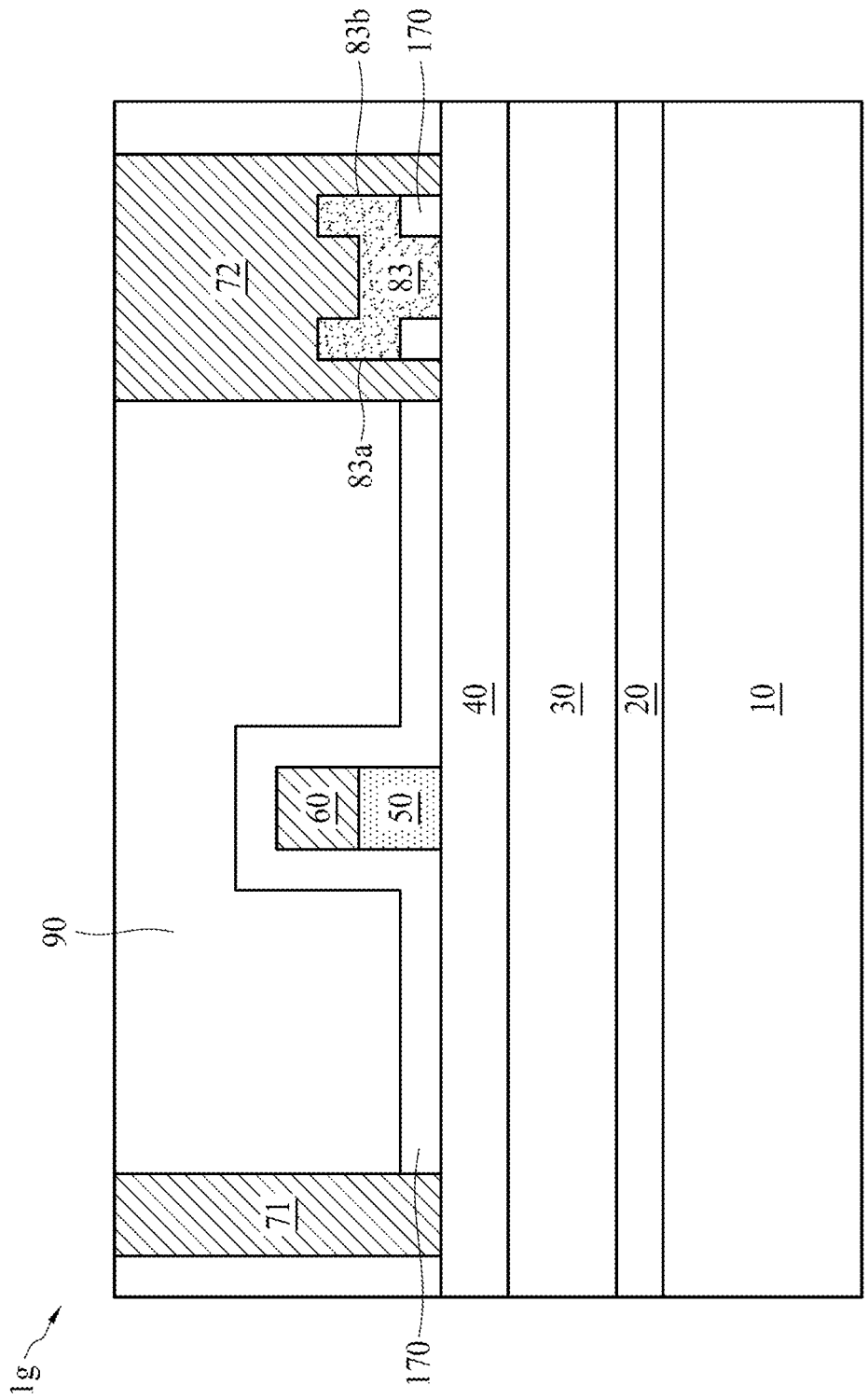

Referring to FIG. 12D, a source 71, a drain 72, a passivation layer 90 and a field plate 100 are formed to manufacture the semiconductor device 1g. In some embodiments, a part of the sacrificial layer 170 is inlaid into the drain 72.

In the present embodiment, the sacrificial layer 170 is formed to protect the barrier layer 40, which reduces damage of an etching agent to the barrier layer 40 and avoid degradation of the semiconductor device 1g.

Figure 13B:
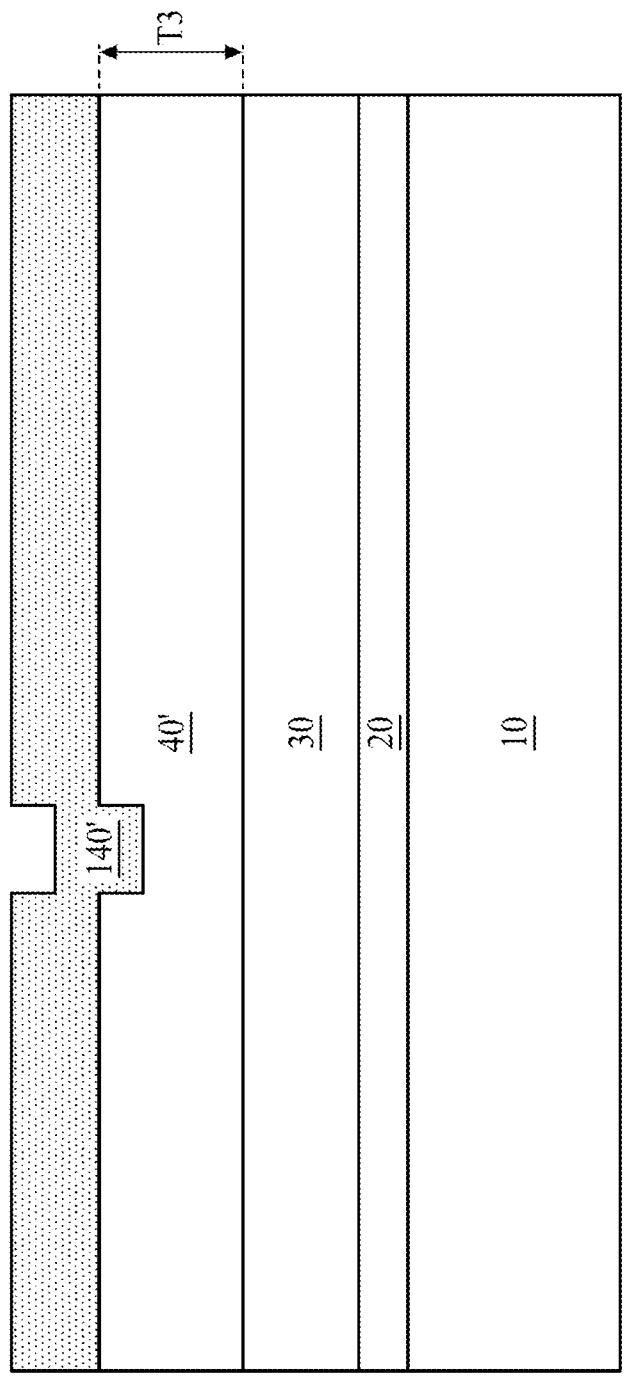
Figure 13C:
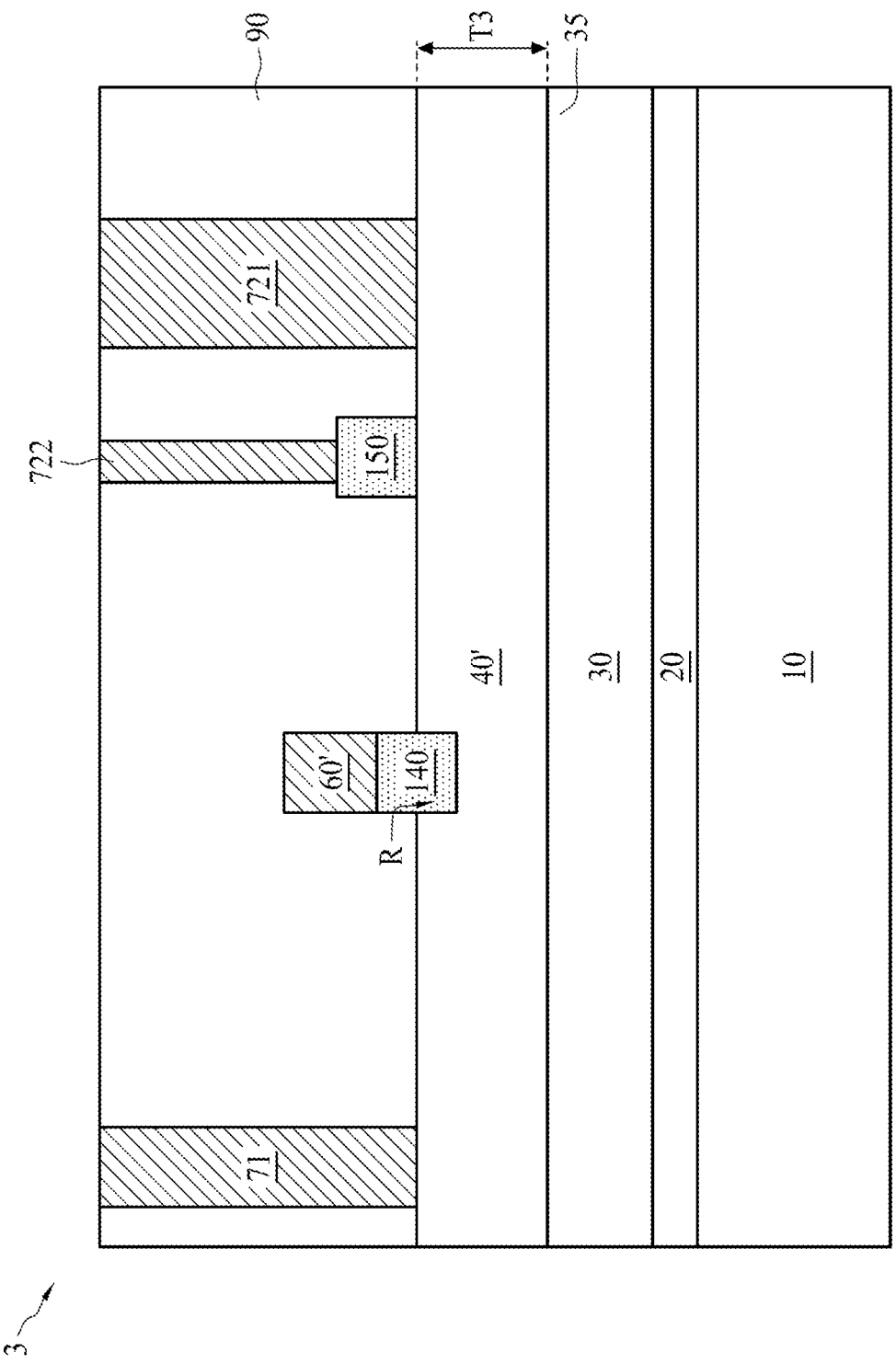

FIG. 13A, FIG. 13B and FIG. 13C show a plurality of operations for manufacturing the semiconductor device 3 according to the comparative example.

As shown in FIG. 13A, the substrate 10 is provided, and the buffer layer 20, the channel layer 30 and the barrier layer 40' are formed on the substrate 10. The barrier layer 40' has a thickness T3. The thickness T3 ranges from about 60 nm to 100 nm. After the barrier layer 40' is formed, a recess R is formed through the etching process.

As shown in FIG. 13B, a p-type doped III-V material 140' is formed, and the recess R is filled with the p-type doped III-V material.

Then, the p-type doped III-V material 140' is patterned to form the p-type doped III-V layer 140 and the p-type doped III-V layer 150. Then, the source 71, the first drain 721, the second drain 722 and the passivation layer 90 are formed to manufacture the semiconductor device 3.

In the comparative example, after the barrier layer 40' is formed, the recess R is formed. Therefore, the p-type doped III-V material 140' and the barrier layer 40' cannot be formed in the same cavity. That is, the p-type doped III-V material 140' is formed by the secondary epitaxy technology. Therefore, the semiconductor device 3 of the comparative example has the defect that the barrier layer 40' and/or the p-type doped III-V layer 140 are polluted.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientation shown in the figures, space-related terms are intended to encompass different orientations of the device in use or operation. A device may be oriented in other ways (rotate the passivation layer by 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or +0.5% of the given value or range. The range may be indicated herein as from one endpoint to another endpoint or between two endpoints. Unless otherwise specified, all the ranges disclosed in the present disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within +10%, ±5%, +1%, or +0.5% of the average of the values.

Several embodiments of the present disclosure and features of details are briefly described above. The embodiments described in the present disclosure may be easily used as a basis for designing or modifying other processes and structures for realizing the same or similar objectives and/or obtaining the same or similar advantages introduced in the embodiments of the present disclosure. Such equivalent construction does not depart from the spirit and scope of the present disclosure, and various variations, replacements, and modifications can be made without departing from the spirit and scope of the present disclosure.

What is claimed is:

1. A semiconductor device, comprising:
a substrate;
a channel layer disposed on the substrate;
a barrier layer disposed on the channel layer;
a p-type doped III-V layer disposed on the barrier layer;
a gate disposed on the p-type doped III-V layer;
a source and a drain disposed on two opposite sides of the gate; and
a doped semiconductor layer, provided with a first side close to the gate and a second side away from the gate, wherein the drain covers the first side of the doped semiconductor layer; and
a first field plate, extending from the drain to the gate, wherein the first field plate is provided with a lower surface higher than an upper surface of the gate.

2. The semiconductor device according to claim 1, wherein the doped semiconductor layer comprises a p-type dopant.

3. The semiconductor device according to claim 1, wherein the doped semiconductor layer comprises p-GaN, p-AlGaN, p-Si, pNiO$_x$, p-Cu$_2$O, p-GaAs or a combination of the above.

4. The semiconductor device according to claim 1, wherein materials of the doped semiconductor layer and the p-type doped III-V layer are different.

5. The semiconductor device according to claim 1, wherein the drain covers the second side of the doped semiconductor layer.

6. The semiconductor device according to claim 1, further comprising:
a second field plate, extending from the drain to the gate, wherein the first field plate covers the second field plate.

7. The semiconductor device according to claim 6, wherein a width of the first field plate is greater than a width of the second field plate.

8. The semiconductor device according to claim 1, wherein the doped semiconductor layer is provided with a plurality of parts, the parts being separated from one another, and an arranging direction of the parts being parallel to an extending direction of the drain.

9. A semiconductor device, comprising:
a substrate;
a channel layer disposed on the substrate;
a barrier layer disposed on the channel layer;
a first gate and a second gate disposed on the barrier layer;

a drain disposed between the first gate and the second gate;

a first source and a second source respectively disposed on one side of the first gate away from the drain and one side of the second gate away from the drain; and a doped semiconductor layer, provided with a first side close to the first gate and a second side close to the second gate, wherein the drain covers the first side and the second side of the doped semiconductor layer.

10. The semiconductor device according to claim 9, wherein the doped semiconductor layer comprises a p-type dopant.

11. The semiconductor device according to claim 9, wherein the doped semiconductor layer comprises a crystal structure.

12. The semiconductor device according to claim 9, wherein the doped semiconductor layer comprises an amorphous structure.

13. The semiconductor device according to claim 9, further comprising:

a p-type doped III-V layer disposed between the barrier layer and the first gate, wherein materials of the doped semiconductor layer and the p-type doped III-V layer are different.

14. The semiconductor device according to claim 9, further comprising:

a first field plate extending from the drain to the first gate; and a second field plate extending from the drain to the second gate, wherein the first field plate is provided with a lower surface higher than an upper surface of the first gate.

15. The semiconductor device according to claim 14, further comprising:

a third field plate surrounding the drain, wherein a first distance is formed between the first field plate and the barrier layer, a second distance is formed between the third field plate and the barrier layer, and the first distance is greater than the second distance.

16. A manufacturing method of a semiconductor device, comprising:

providing a substrate;

forming a channel layer on the substrate;

forming a barrier layer on the channel layer;

forming a p-type doped III-V layer on the barrier layer;

forming a gate on the p-type doped III-V layer;

forming a doped semiconductor layer on the barrier layer;

forming a source and a drain on two opposite sides of the gate, wherein the drain covers one side of the doped semiconductor layer close to the gate; and forming a first field plate, extending from the drain to the gate, wherein the first field plate is provided with a lower surface higher than an upper surface of the gate.

17. The manufacturing method according to claim 16, wherein forming the doped semiconductor layer comprises:

performing a deposition process to deposit a semiconductor material to cover the gate and the barrier layer; and patterning the semiconductor material to form the doped semiconductor layer.

18. The manufacturing method according to claim 17, wherein forming the doped semiconductor layer comprises:

performing an ion implantation process to implant a dopant into the semiconductor material.

19. The manufacturing method according to claim 16, wherein forming the doped semiconductor layer comprises:

performing an epitaxial growing process to form a semiconductor crystal layer on the barrier layer; and patterning the semiconductor crystal layer to form the doped semiconductor layer.

\* \* \* \* \*